US012796377B2

(12) United States Patent
Anamoto et al.

(10) Patent No.: US 12,796,377 B2
(45) Date of Patent: Nov. 10, 2026

(54) SUBSTRATE PROCESSING APPARATUS AND SUBSTRATE PROCESSING METHOD

(71) Applicant: Tokyo Electron Limited, Tokyo (JP)

(72) Inventors: Atsushi Anamoto, Koshi City (JP); Shinichi Umeno, Koshi City (JP)

(73) Assignee: Tokyo Electron Limited, Tokyo (JP)

( * ) Notice: Subject to any disclaimer, the term of this patent is extended or adjusted under 35 U.S.C. 154(b) by 446 days.

(21) Appl. No.: 18/485,469

(22) Filed: Oct. 12, 2023

(65) Prior Publication Data

US 2024/0128101 A1 Apr. 18, 2024

(30) Foreign Application Priority Data

Oct. 14, 2022 (JP) ................................ 2022-165635

(51) Int. Cl.
*H10P 72/00* (2026.01)
*G05D 9/12* (2006.01)
*H10P 74/00* (2026.01)

(52) U.S. Cl.
CPC ........... *H10P 72/0604* (2026.01); *G05D 9/12* (2013.01); *H10P 72/0404* (2026.01); *H10P 74/238* (2026.01)

(58) Field of Classification Search
CPC ............. H10P 72/0604; H10P 72/0404; H10P 74/238; G05D 9/12
See application file for complete search history.

(56) References Cited

U.S. PATENT DOCUMENTS

2020/0254389 A1* 8/2020 Numata ................. B01D 29/25
2020/0357662 A1* 11/2020 Muta ................ H01L 21/67178
2023/0068426 A1* 3/2023 Lee ...................... B41J 2/16517

FOREIGN PATENT DOCUMENTS

JP 2019-041039 A 3/2019
JP 2019-129243 * 8/2019
JP 2019129243 A * 8/2019 ........... H01L 21/027

OTHER PUBLICATIONS

Machine Translation: JP-2019129243-A (Year: 2018).*

* cited by examiner

*Primary Examiner* — Benjamin Tzu-Hung Liu
(74) *Attorney, Agent, or Firm* — Armstrong Teasdale LLP

(57) ABSTRACT

A substrate processing apparatus includes: a reservoir configured to temporarily store a processing liquid for processing a substrate; a replenisher configured to replenish the processing liquid to the reservoir; a flow rate measurer configured to measure a flow rate of the processing liquid replenished to the reservoir; a gas supplier configured to supply gas to the reservoir to pressurize an interior of the reservoir; and a controller, wherein the controller is configured to control the gas supplier based on a value measured by the flow rate measurer to execute a process of replenishing the processing liquid from the replenisher to the reservoir while regulating a magnitude of an internal pressure of the reservoir.

18 Claims, 16 Drawing Sheets

SUBSTRATE PROCESSING APPARATUS AND SUBSTRATE PROCESSING METHOD

CROSS-REFERENCE TO RELATED APPLICATION

This application is based upon and claims the benefit of priority from Japanese Patent Application No. 2022-165635, filed on Oct. 14, 2022, the entire contents of which are incorporated herein by reference.

TECHNICAL FIELD

The present disclosure relates to a substrate processing apparatus and a substrate processing method.

BACKGROUND

Patent Document 1 discloses a liquid processing apparatus including: a storage tank that stores a processing liquid, a circulation line that returns the processing liquid sent from the storage tank to the storage tank, and a supply line that connects the circulation line to an ejection nozzle that ejects the processing liquid onto a substrate. When the processing liquid is not ejected from the nozzle through the supply line, the processing liquid circulates through the circulation line.

PRIOR ART DOCUMENTS

Patent Documents

Patent Document 1: Japanese Patent Laid-Open Publication No. 2019-041039

SUMMARY

According to one embodiment of the present disclosure, a substrate processing apparatus includes: a reservoir configured to temporarily store a processing liquid for processing a substrate; a replenisher configured to replenish the processing liquid to the reservoir; a flow rate measurer configured to measure a flow rate of the processing liquid replenished to the reservoir; a gas supplier configured to supply gas to the reservoir to pressurize an interior of the reservoir; and a controller, wherein the controller is configured to control the gas supplier based on a value measured by the flow rate measurer to execute a process of replenishing the processing liquid from the replenisher to the reservoir while regulating a magnitude of an internal pressure of the reservoir.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
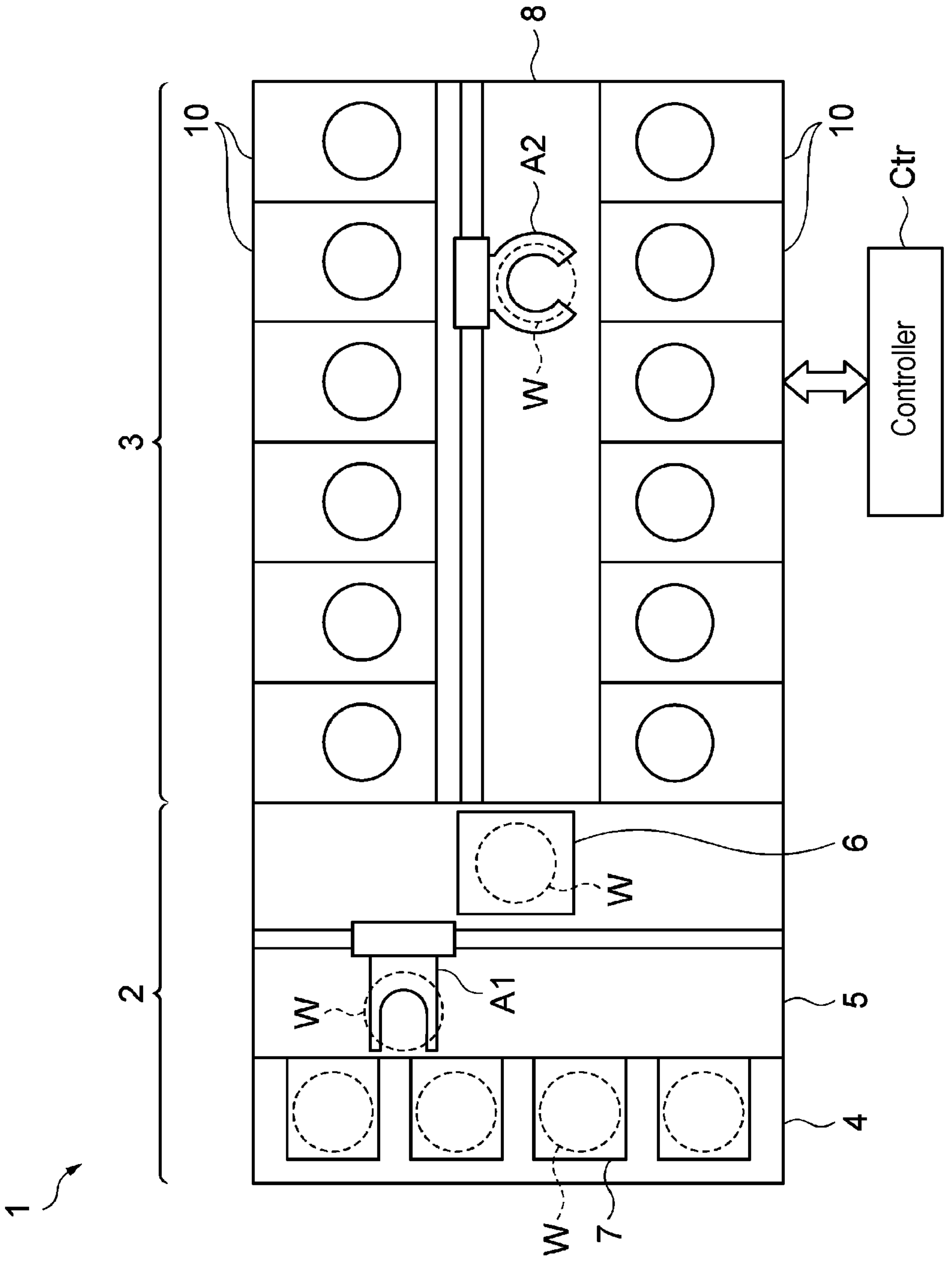
FIG. 1 is a plan view schematically illustrating an example of a substrate processing system.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. In the following description, the same reference numerals will be used for the same elements or elements having the same function, and redundant descriptions thereof will be omitted. In this specification, the top, bottom, right, and left of the drawings are based on the directions of the symbols in the drawings.

[Substrate Processing System]

First, a substrate processing system 1 (substrate processing apparatus) configured to process a substrate W will be described with reference to FIGS. 1 and 2. The substrate processing system 1 includes a carry-in/out station 2, a processing station 3, and a controller Ctr. The carry-in/out station 2 and the processing station 3 may be aligned in, for example, the horizontal direction.

The substrate W may have a disk shape or may have a plate shape other than a circular shape, such as a polygonal shape. The substrate W may have a cutout portion in which the substrate W is partially cut out. The cutout portion may be, for example, a notch (a groove having a U-shape, a V-shape, or the like) or a linear portion (a so-called orientation flat) extending linearly. The substrate W may be, for example, a semiconductor substrate (a silicon wafer), a glass substrate, a mask substrate, a flat panel display (FPD) substrate, or various other substrates. A diameter of the substrate W may be, for example, about 200 mm to 450 mm.

The carry-in/out station 2 includes a placement section 4, a carry-in/out section 5, and a shelf unit 6. The placement section 4 includes a plurality of stages (not illustrated) arranged in a width direction (the vertical direction in FIG. 1). Each stage is configured to place a carrier 7 thereon. Each carrier 7 is configured to accommodate at least one substrate W in a sealed state. The carrier 7 includes an opening/closing door (not illustrated) through which the substrate W is carried-in/out.

Figure 2:
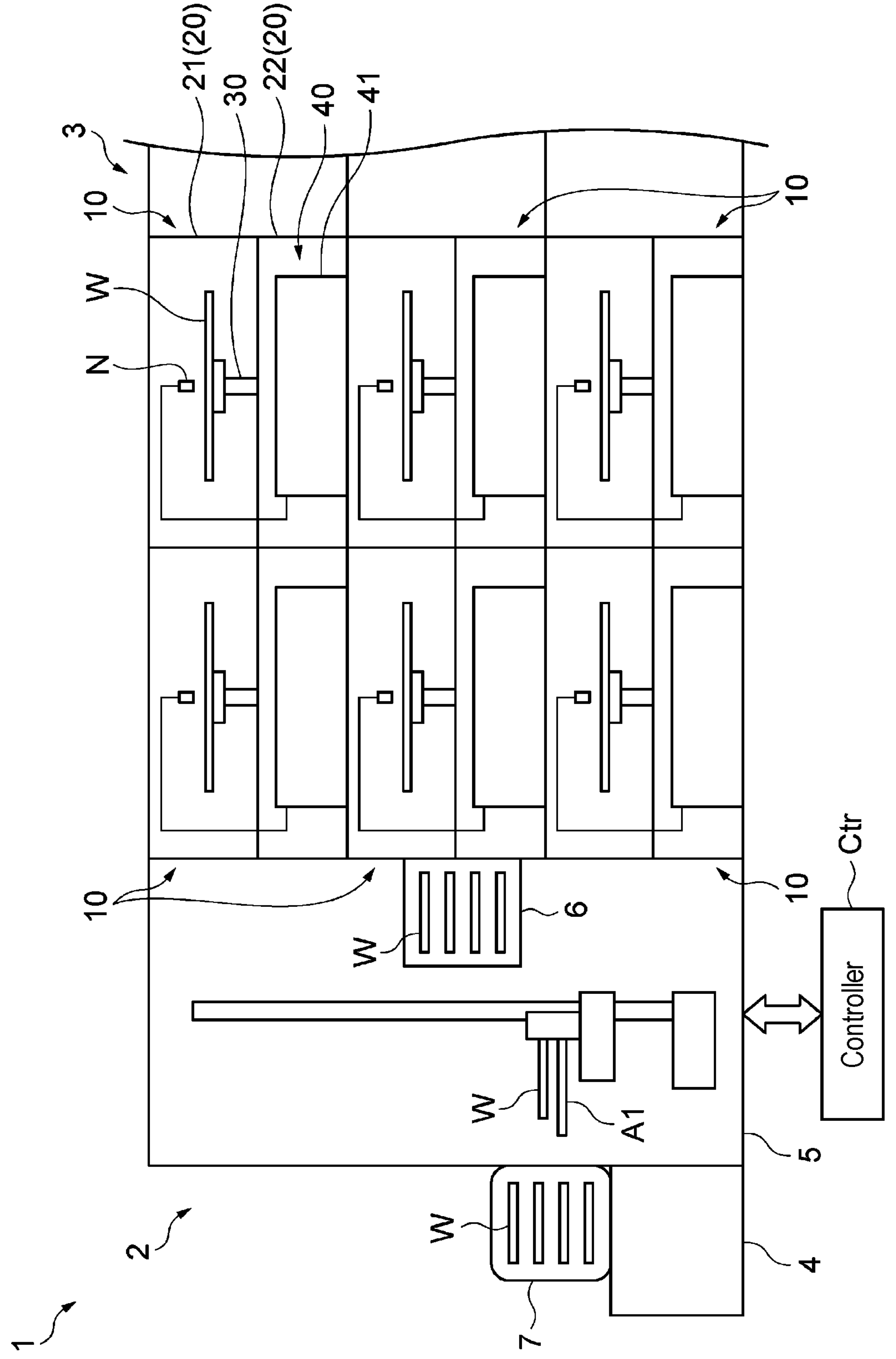
FIG. 2 is a side view schematically illustrating the substrate processing system of FIG. 1.

The carry-in/out section 5 is disposed adjacent to the placement section 4 in the direction in which the carry-in/out station 2 and the processing station 3 are arranged (the horizontal direction in FIG. 1). The carry-in/out section 5 includes an opening/closing door (not illustrated) provided for the placement section 4. In the state in which the carrier 7 is placed on the placement section 4, the opening/closing door of the carrier 7 and the opening/closing door of the carry-in/out section 5 are both opened, so that the interior of the carry-in/out section 5 and the interior of the carrier 7 communicate with each other.

The carry-in/out section 5 incorporates a transfer arm A1 and a shelf unit 6. The transfer arm A1 is configured to move horizontally in the width direction of the carry-in/out section 5 (the vertical direction in FIG. 1), move vertically in the vertical direction (the vertical direction in FIG. 2), and swivel around the vertical axis. The transfer arm A1 is configured to take out the substrate W from the carrier 7 and transfer the same to the shelf unit 6, and is also configured to receive the substrate W from the shelf unit 6 and return the same to the carrier 7. The shelf unit 6 is located near the processing station 3 and is configured to mediate the transfer of the substrate W between the carry-in/out section 5 and the processing station 3.

The processing station 3 includes a transfer section 8 and a plurality of processing units 10. In an embodiment, the transfer section 8 extends horizontally in the direction in which the carry-in/out stations 2 and the processing stations 3 are arranged (the left-right direction in FIG. 1). The transfer section 8 incorporates a transfer arm A2. The transfer arm A2 is configured to move horizontally in the length direction of the transfer section 8 (the horizontal direction in FIG. 1), move vertically in the vertical direction, and swivel around the vertical axis. The transfer arm A2 is configured to take out the substrate W from the shelf unit 6 and transfer the same to a processing unit 10, and is further configured to receive the substrate W from the processing unit 10 and return the same to the shelf unit 6.

[Processing Unit]

Next, details of the processing unit 10 will be described with reference to FIG. 2. The processing unit 10 is configured to perform predetermined liquid-processing (e.g., removal of dirt and foreign matter, etching, and the like) on the substrate W. The processing unit 10 may be a single-wafer-type cleaning device which cleans substrates W one by one by, for example, spin cleaning. In the processing station 3, the plurality of processing units 10 (three processing units 10 in the example of FIG. 2) may be vertically stacked.

The processing unit 10 includes a chamber 20 (container), a rotary holder 30, and a liquid supplier 40. The chamber 20 is a housing configured such that the substrate W can be carried into and carried out from the interior thereof. A carry-in/out port (not illustrated) is formed in a sidewall of the chamber 20. The substrate W is carried into the chamber 20 and carried out from the chamber 20 through the carry-in/out port by the transfer arm A2.

The chamber 20 is configured to accommodate the rotary holder 30 and the liquid supplier 40. That is, one rotary holder 30 and one liquid supplier 40 are disposed in one chamber 20. The chamber 20 includes an upper chamber 21 and a lower chamber 22. The upper chamber 21 is disposed above the lower chamber 22.

The rotary holder 30 is configured to hold and rotate the substrate W. The rotary holder 30 is disposed inside the upper chamber 21. The liquid supplier 40 is configured to supply a processing liquid L (see FIG. 3) from a nozzle N to the substrate W. The liquid supplier 40 includes a housing 41 that accommodates some of elements of the liquid supplier 40. The housing 41 is disposed inside the lower chamber 22. The liquid supplier 40 may be disposed inside the upper chamber 21, and the rotary holder 30 may be disposed inside the lower chamber 22.

The processing liquid L may be, for example, an etchant, an organic processing liquid, or a developer. The etchant may be, for example, an acid-based chemical liquid or an alkaline-based chemical liquid. The acid-based liquid may include, for example, SC-2 liquid (a mixed liquid of hydrochloric acid, hydrogen peroxide, and pure water), SPM (a mixed liquid of sulfuric acid and hydrogen peroxide), HF (hydrofluoric acid), DHF (dilute hydrofluoric acid), $HNO_3$+HF liquid (a mixed liquid of nitric acid and hydrofluoric acid), and the like. The alkaline-based chemical liquid may include, for example, SC-1 solution (a mixed liquid of ammonia, hydrogen peroxide, and pure water), hydrogen peroxide solution, and the like. The organic processing liquid may include, for example, isopropyl alcohol (IPA), thinner, and the like.

[Liquid Supplier]

Figure 3:
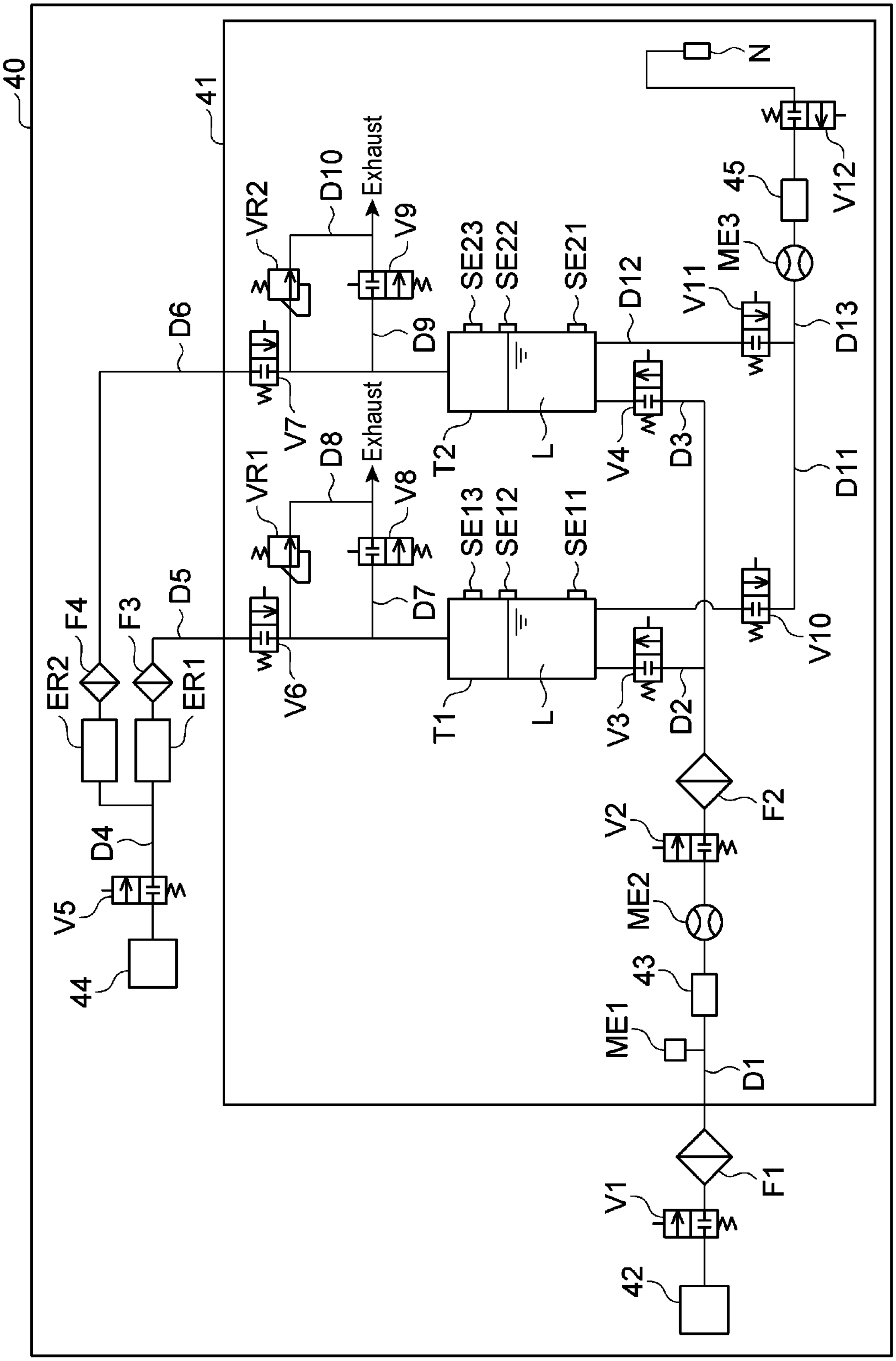
FIG. 3 is a view schematically illustrating an example of a processing liquid supplier.

Next, details of the liquid supplier 40 will be described with reference to FIG. 3. The liquid supplier 40 includes a liquid source 42 (replenisher), valves V1 to V12, filters F1 to F4, a pressure gauge ME1 (pressure measurer), a cooler 43, flow meters ME2 and ME3, tanks T1 and T2, a gas source 44 (gas supplier), electropneumatic regulators ER1 and ER2 (gas supplier), relief valves VR1 and VR2, a nozzle N, and a heater 45.

The liquid source 42 is a source of the processing liquid L, and is configured to replenish the processing liquid L to the tanks T1 and T2. The liquid source 42 is connected to the tank T1 (a reservoir) via pipes D1 and D2, and is connected to the tank T2 (separate reservoir) via pipes D1 and D3. That is, an upstream end of the pipe D1 is connected to the liquid source 42. A downstream end of the pipe D1 is connected to upstream ends of pipes D2 and D3. A downstream end of the pipe D2 is connected to a bottom wall of the tank T1. A downstream end of the pipe D3 is connected to a bottom wall of the tank T2.

The valve V1, the filter F1 (separate filter), the pressure gauge ME1, the cooler 43, the flow meter ME2 (flow rate measurer), the valve V2, and the filter F2 are arranged in order from upstream of the pipe D1. Although not illustrated, the pipe D1 may be branched between the filter F1 and the pressure gauge ME1, so that the processing liquid L may be supplied to the housing 41 of the liquid supplier 40 of another processing unit 10 among the plurality of processing units 10 arranged in the vertical direction.

The valve V3 (flow regulator) is disposed in the pipe D2. That is, the valve V3 is disposed between the filter F2 and the tank T1 and is configured to be capable of regulating a flow rate of the processing liquid L flowing into the tank T1 depending on a degree of opening thereof. The valve V4 (flow regulator) is disposed in the pipe D3. That is, the valve V4 is disposed between the filter F2 and the tank T2 and is configured to be capable of regulating a flow rate of the processing liquid L flowing into the tank T2 depending on a degree of opening thereof.

Each of the valves V1 to V4 is configured to be opened/closed based on an operation signal from the controller Ctr. The filter F1 is disposed upstream of the flow meter ME2.

The filter F1 is configured to remove impurities contained in the processing liquid L flowing through the pipe D1. The filter material constituting the filter F1 may be made of, for example, polytetrafluoroethylene (PTFE), polyethylene (PE), or the like. In this case, metal-containing impurities contained in the processing liquid L are removed by the filter F1.

The pressure gauge ME1 is configured to measure a pressure of the processing liquid L flowing through the pipe D1 and to transmit the measured data to the controller Ctr. The cooler 43 is configured to operate based on an operation signal from the controller Ctr to cool the processing liquid L flowing through the pipe D1. By cooling the processing liquid L with the cooler 43, the organic matter contained in the processing liquid L is aggregated This makes it easier for the filter F2 disposed downstream of the cooler 43 to remove the organic matter.

The flow meter ME2 is configured to measure a flow rate of the processing liquid L flowing through the pipe D1 and to transmit the measured data to the controller Ctr. The filter F2 is disposed between the flow meter ME2 and the tanks T1 and T2. The filter F2 is configured to remove impurities contained in the processing liquid L flowing through the pipe D1. The filter material constituting the filter F2 may be made of, for example, polyimide, polytetrafluoroethylene (PTFE), polychlorotrifluoroethylene (PCTFE), nylon, or the like.

The tanks T1 and T2 are configured to temporarily store the processing liquid L. The tank T1 is provided with sensors SE11 to SE13 (detectors). The tank T2 is provided with sensors SE21 to SE23 (detectors). The sensors SE11 to SE13 and SE21 to SE23 are so-called water-level gauges and are configured to measure a level (liquid level height) of the processing liquid L in the tanks T1 and T2. The sensors SE11 to SE13 and SE21 to SE23 are configured to transmit measured liquid level data to the controller Ctr.

The sensors SE11 to SE13 are arranged in that order from the bottom with respect to the tank T1. Specifically, the sensor SE11 is disposed near the bottom of the tank T1. The sensor SE12 is arranged in an upper portion of the tank T1. The sensor SE13 is arranged in the vicinity of the top of the tank T1. That is, when the liquid level in the tank T1 rises beyond the vicinity of the bottom of the tank T1, the sensor SE11 is turned ON, and when the liquid level in the tank T1 becomes lower than the vicinity of the bottom of the tank T1, the sensor SE11 is turned OFF. The same applies to the sensors SE12 and SE13 also.

The sensors SE21 to SE23 are arranged in that order from the bottom with respect to the tank T2. Specifically, the sensor SE21 is disposed near the bottom of the tank T2. The sensor SE22 is arranged in an upper portion of the tank T2. The sensor SE23 is arranged in the vicinity of the top of the tank T2. That is, when the liquid level in the tank T2 rises beyond the vicinity of the bottom of the tank T2, the sensor SE21 is turned ON, and when the liquid level in the tank T2 becomes lower than the vicinity of the bottom of the tank T2, the sensor SE21 is turned OFF. The same applies to the sensors SE22 and SE23 also.

The gas source 44 is a source of gas and is configured to supply the gas to the tanks T1 and T2 to pressurize the interior of the tanks T1 and T2. The gas may be, for example, an inert gas. For example, a nitrogen gas may be used as the inert gas. The gas source 44 is connected to the tank T1 via pipes D4 and D5 (first flow path) and is connected to the tank T2 via pipes D4 and D6 (first flow path). That is, an upstream end of the pipe D4 is connected to the gas source 44. A downstream end of the pipe D4 is connected to upstream ends of pipes D5 and D6. A downstream end of the pipe D5 is connected to a ceiling wall of the tank T1. A downstream end of the pipe D6 is connected to a ceiling wall of the tank T2.

The valve V5 is disposed in the pipe D4. The electropneumatic regulator ER1, the filter F3, and the valve V6 are arranged in order from upstream of the pipe D5. The electropneumatic regulator ER2, the filter F4, and the valve V7 are arranged in order from upstream of the pipe D6.

A pipe D7 (second flow path) branches and extends from between the valve V6 (gas supplier) in the pipe D5 and the tank T1. A downstream end of the pipe D7 is connected to an exhaust port. The valve V8 is disposed in the pipe D7. A pipe D8 branches and extends from between the valve V6 in the pipe D5 and the branch point of the pipe D7. A downstream end of the pipe D8 is connected to a downstream side of the valve V8 in the pipe D7. The relief valve VR1 is disposed in the pipe D8.

A pipe D9 (second flow path) branches and extends from between the valve V7 (gas supplier) in the pipe D6 and the tank T2. A downstream end of the pipe D9 is connected to an exhaust port. The valve V9 is disposed in the pipe D9. A pipe D10 branches and extends from between the valve V7 in the pipe D6 and the branch point of the pipe D9. A downstream end of the pipe D10 is connected to a downstream side of the valve V10 in the pipe D9. The relief valve VR2 is disposed in the pipe D10.

Each of the valves V5 to V9 is configured to be opened/closed based on an operation signal from the controller Ctr. The electropneumatic regulators ER1 and ER2 are configured to operate based on an operation signal from the controller Ctr and to control a pressure of the gas supplied from the gas source 44 in a non-stepwise manner in proportion to the electric signal. That is, the electropneumatic regulators ER1 and ER2 are configured to be capable of adjusting a magnitude of the pressure of the gas in the tanks T1 and T2.

The filters F3 and F4 are configured to remove impurities contained in the gases flowing through the pipes D5 and D6, respectively. Each of the relief valves VR1 and VR2 is configured to automatically release a pressure when the pressure higher than a predetermined pressure is generated in the pipes D5 and D6.

The nozzle N is disposed in the upper chamber 21 to be located above the substrate W held by the rotary holder 30. The nozzle N may be configured to move horizontally or vertically above the substrate W by a driving source (not illustrated).

The nozzle N is connected in a fluidic sense to the tank T1 via pipes D11 and D13, and is connected in a fluidic sense to the tank T2 via pipes D12 and D13. That is, an upstream end of the pipe D11 is connected to the bottom wall of the tank T1. A downstream end of the pipe D11 is connected to a downstream end of the pipe D12 and an upstream end of the pipe D13. An upstream end of the pipe D12 is connected to the bottom wall of the tank T2. The downstream end of the pipe D12 is connected to the downstream end of the pipe D11 and the upstream end of the pipe D13. The downstream end of the pipe D13 is connected to the nozzle N.

The valve V10 is disposed in the pipe D11. The valve V11 is disposed in the pipe D12. The flow meter ME3, the heater 45, and the valve 12 are arranged in order from upstream of the pipe D13.

Each of the valves V10 to V12 is configured to be opened/closed based on an operation signal from the controller Ctr. The flow meter ME3 is configured to measure a flow rate of the processing liquid L flowing through the pipe D13 and to transmit the measured data to the controller Ctr.

The heater 45 is configured to operate based on an operation signal from the controller Ctr and to heat the processing liquid L flowing through the pipe D13. By heating the processing liquid L with the heater 45, the processing liquid L has a temperature suitable for substrate processing. By heating the processing liquid L immediately before the processing liquid L is ejected from the nozzle N in this manner, elution of foreign matter, such as particles, from each component is suppressed. This makes it possible to improve the cleanliness of the processing liquid L supplied to the substrate W.

[Details of Controller]

Figure 4:
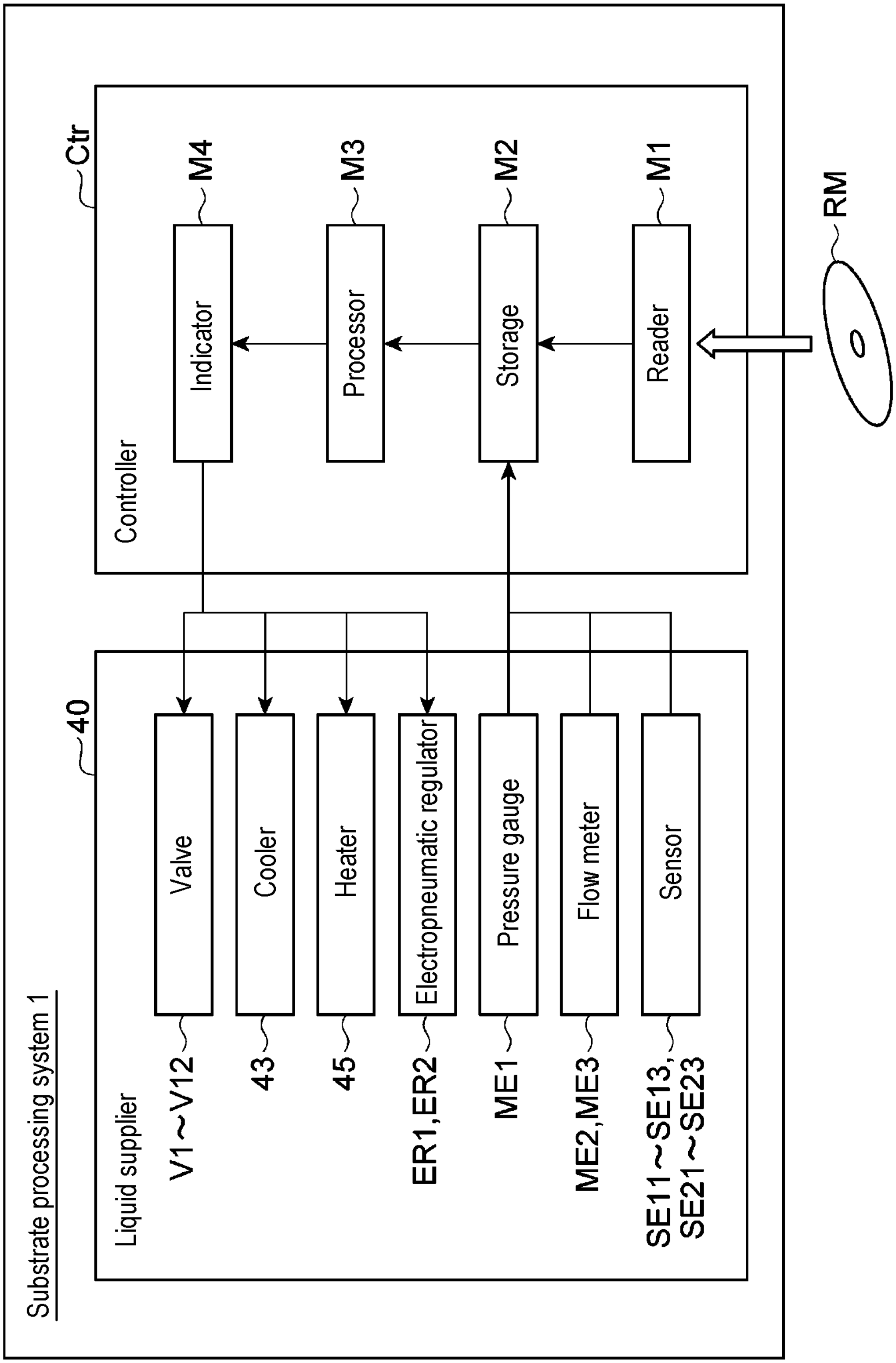
FIG. 4 is a block diagram illustrating an example of main components of the substrate processing system.

The controller Ctr is configured to partially or wholly control the substrate processing system 1. As illustrated in FIG. 4, the controller Ctr includes, as functional modules, a reader M1, a storage M2, a processor M3, and an indicator M4. These functional modules merely correspond to the functions of the controller Ctr divided into a plurality of modules for the sake of convenience in description and do not necessarily mean that hardware constituting the controller Ctr is divided into such modules. Each functional module is not limited to that implemented by executing a program, and may be implemented by a dedicated electric circuit (e.g., a logic circuit) or an integrated circuit in which the dedicated electric circuit is integrated (an application-specific integrated circuit (ASIC)).

The reader M1 is configured to read a program from a non-transitory computer-readable recording medium RM. The recording medium RM stores a program for operating each part of the substrate-processing system 1. The recording medium RM may be, for example, a semiconductor memory, an optical recording disk, a magnetic recording disk, or a magneto-optical recording disk. Hereinafter, each part of the substrate processing system 1 may include each of the valves V1 to V12, the cooler 43, the heater 45, and the electropneumatic regulators ER1 and ER2.

The storage M2 is configured to store various pieces of data. The storage M2 may store, for example, a program read from the recording medium RM by the reader M1, set data input via an external input device (not illustrated) by an operator, and the like. The storage M2 may store, for example, data of processing conditions (a processing recipe) for processing the substrate W. The storage M2 may store, for example, pressure data measured by the pressure gauge ME1, flow rate data measured by the flow meters ME2 and ME3, and liquid level data acquired by the sensors SE11 to SE13 and SE21 to SE23.

The processor M3 is configured to process various pieces of data. The processor M3 may generate a signal for operating each part of the substrate processing system 1 based on, for example, various pieces of data stored in the storage M2. The processor M3 may generate a signal for regulating opening degrees of the valves V3 and V4, for example, based on pressure data measured by the pressure gauge ME1. As a result, the flow rate of the processing liquid L flowing into the tanks T1 and T2 is regulated. The processing for regulating the opening degrees of the valves V3 and V4 may be always performed while the tanks T1 and T2 are being replenished with the processing liquid L, or may be performed at a time where replenishment of the processing liquid L to the tanks T1 and T2 is started.

The processor M3 may generate a signal for controlling the electropneumatic regulators ER1 and ER2 such that the pressure of gas reaches a predetermined magnitude based on, for example, the flow rate data measured by the flow meter ME2. The processor M3 may generate a signal for controlling the electropneumatic regulators ER1 and ER2 based on, for example, the flow rate data measured by the flow meter ME2 such that the flow rate of the processing liquid L flowing through the filter F2 reaches a flow rate set according to the filter F2. That is, the processor M3 may control the electropneumatic regulators ER1 and ER2 to vary the gas pressure acting in the tanks T1 and T2 such that the flow rate of the processing liquid L flowing through the filter F2 is constant.

The processor M3 may generate a signal for controlling the electropneumatic regulators ER1 and ER2 such that the gas pressure reaches a predetermined magnitude based on, for example, the flow rate data measured by the flow meter ME3. The processor M3 may generate a signal for controlling the electropneumatic regulators ER1 and ER2 based on, for example, the flow rate data measured by the flow meter ME3 such that the flow rate of the processing liquid L flowing through the pipe D13 reaches a predetermined magnitude. That is, the processor M3 may control the electropneumatic regulators ER1 and ER2 to vary the pressure of the gas acting in the tanks T1 and T2 such that the flow rate of the processing liquid L flowing through the pipe D13 reaches a magnitude suitable for processing the substrate W (a magnitude set in a processing recipe). In addition, the pressure of the gas acting in the tanks T1 and T2 may be set higher than the pressure of the gas acting in the tanks T1 and T2 when replenishing the tanks T1 and T2 with the processing liquid L.

The processor M3 may determine which of the tanks T1 and T2 should be pressurized with the gas based on the liquid level data detected by the sensors SE11 to SE13 and SE21 to SE23, and may generate a signal for controlling one of the electropneumatic regulators ER1 and ER2. For example, when it is determined based on the liquid level data detected by the sensors SE11 to SE13 that the amount of the processing liquid L in the tank T1 is less than a predetermined value, the processor M3 may generate a signal for controlling the electropneumatic regulator ER2 to supply the gas to tank T2.

The processor M3 may determine based on the liquid level data detected by the sensors SE11 and the SE21 that the amount of the processing liquid L in the tanks T1 and T2 is at the lower limit. The processor M3 may determine based on the liquid level data detected by the sensors SE12 and the SE22 that the amount of the processing liquid L in the tanks T1 and T2 is at the upper limit. The processor M3 may determine based on the liquid level data detected by the sensors SE13 and the SE23 that the amount of the processing liquid L in the tanks T1 and T2 is in an abnormal state exceeding the upper limit. When this abnormal state is detected, the processor M3 may generate a signal for urgently stopping the replenishment of the processing liquid L to the tanks T1 and T2.

The processor M3 may generate a signal for opening the valves V8 and V9 such that, when supplying the gas to the tanks T1 and T2, the gas is supplied to the tanks T1 and T2 while discharging the gas through the pipes D7 and D9.

The indicator M4 is configured to transmit an operation signal generated by the processor M3 to each part of the substrate processing system 1.

Figure 5:
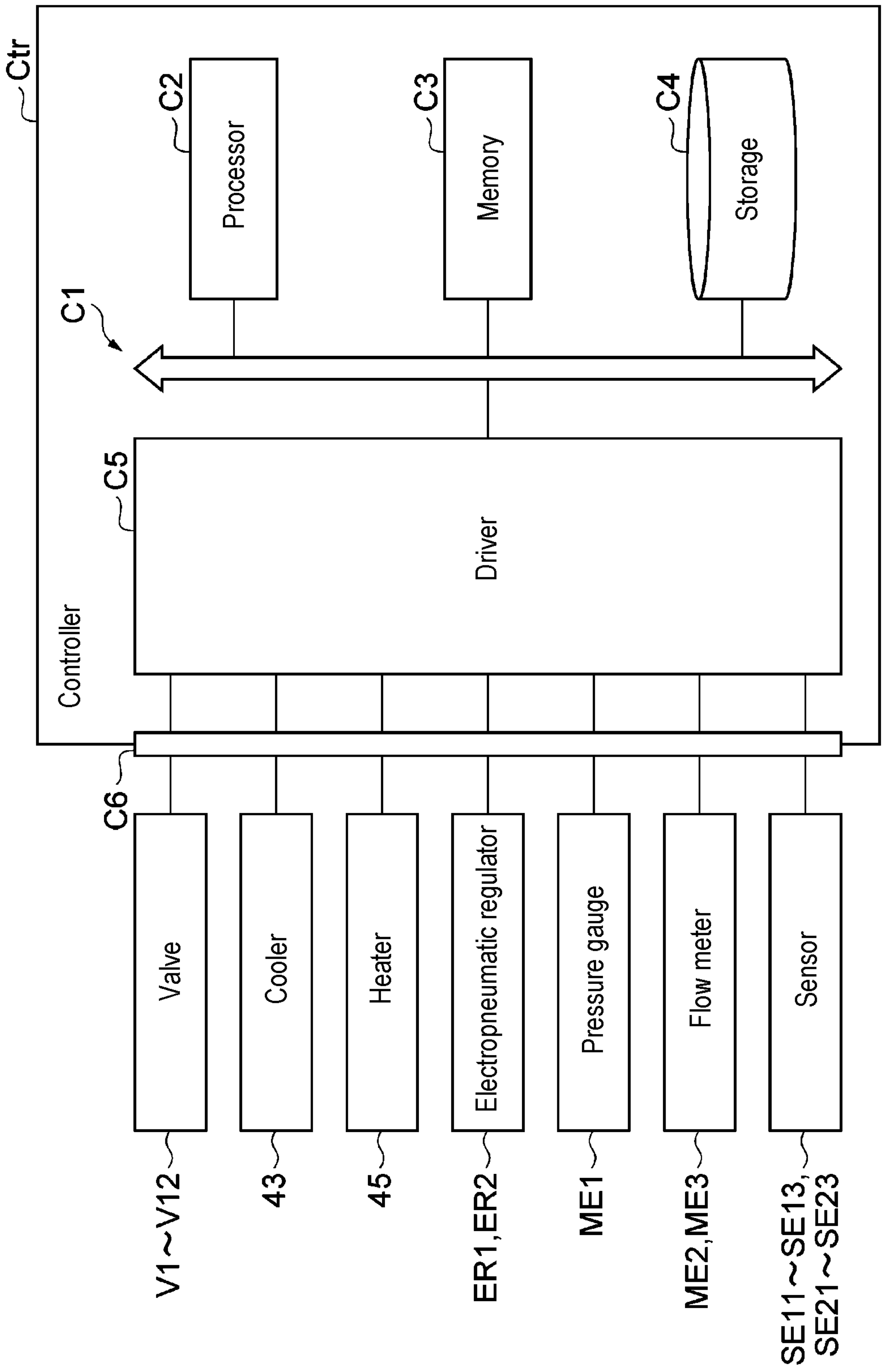
FIG. 5 is a schematic view illustrating an example of a hardware configuration of a controller.

The hardware of the controller Ctr may be configured with, for example, one or more control computers. As illustrated in FIG. 5, the controller Ctr may include a circuit C1 as a hardware configuration. The circuit C1 may be configured with electric circuit elements (circuitry). The circuit C1 may include, for example, a processor C2, a memory C3, a storage C4, a driver C5, and an input/output port C6.

The processor C2 may be configured to implement each of the above-described function modules by executing a program in cooperation with at least one of the memory C3 and the storage C4 and executing input/output of a signal via the input/output port C6. The memory C3 and the storage C4 may function as the above-mentioned storage M2. The driver C5 may be a circuit configured to individually drive each part of the substrate processing system 1. The input/output port C6 may be configured to mediate the input/output of a signal between the driver C5 and each part of the substrate processing system 1.

The substrate processing system 1 may include one controller Ctr, or may include a controller group (controller) including a plurality of controllers Ctr. When the substrate processing system 1 includes a controller group, each of the above-mentioned functional modules may be implemented by one controller Ctr, or may be implemented by a combination of two or more controllers Ctr. When the controller Ctr is configured with a plurality of computers (the circuit C1), each of the above-mentioned functional modules may be implemented by one computer (the circuit C1), or a combination of two or more computers (the circuit C1). The controller Ctr may include a plurality of processors C2. In this case, each of the functional modules may be implemented by one processor C2, or may be implemented by a combination of two or more processors C2.

[Method of Replenishing Tank with Processing Liquid]

Next, a method of replenishing the tanks T1 and T2 with the processing liquid L (a substrate processing method) will be described with reference to FIGS. 6 to 10. Here, the method of replenishing the tank T1 with the processing liquid L and the method of replenishing the tank T2 with the processing liquid L are performed in the same procedure. Therefore, the method of replenishing the tank T1 with the processing liquid L will be described below, and the description of the method of replenishing the tank T2 with the processing liquid L will be omitted.

Figure 6:
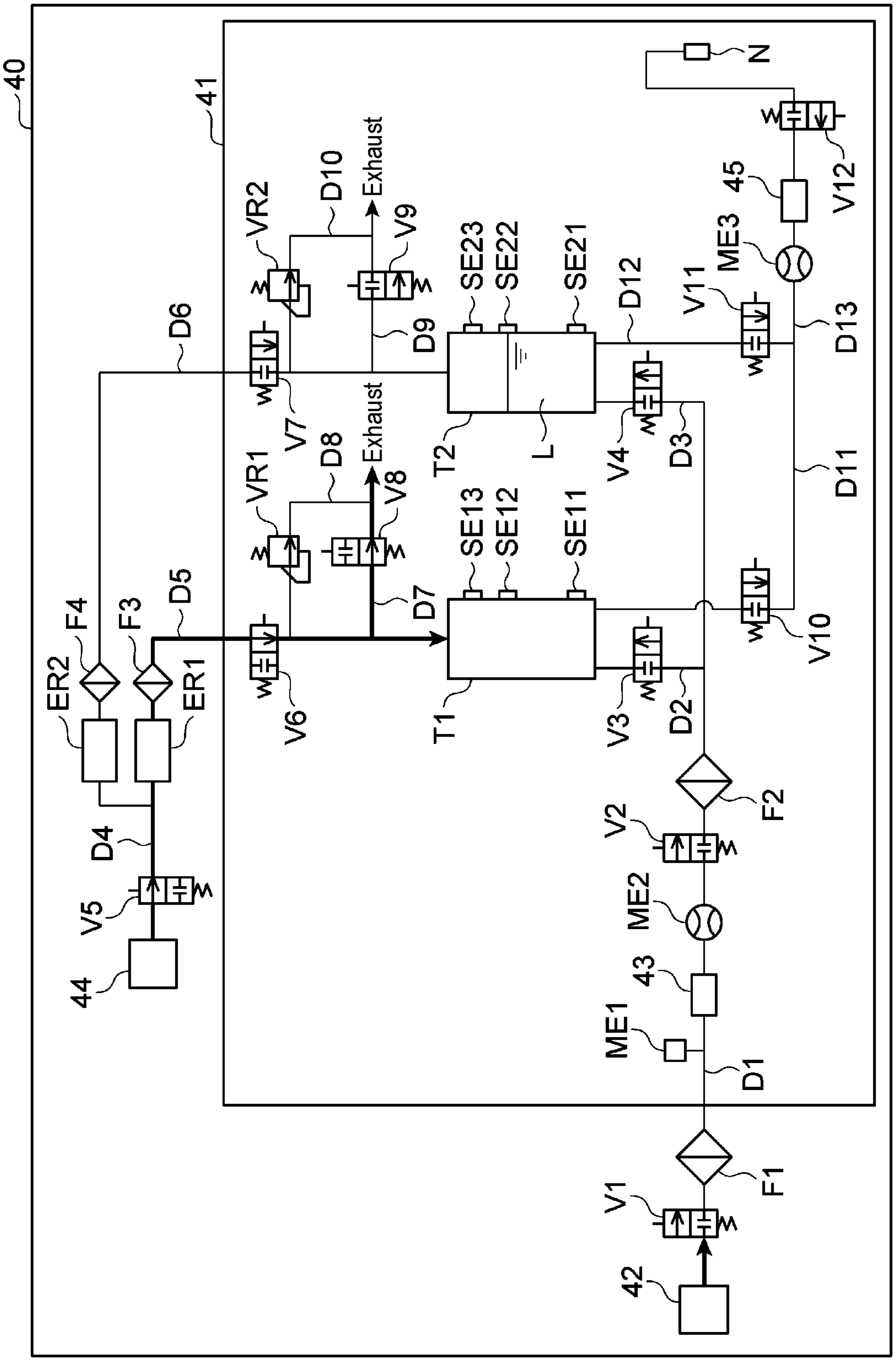
FIG. 6 is a view for explaining an operation of supplying a processing liquid to a tank.

First, as illustrated in FIG. 6, the controller Ctr controls the valves V5, V6, and V8 and the electropneumatic regulator ER1 to open the valves V5, V6, and V8, and pressurize the interior of the tank T1 with gas while exhausting the gas from the pipe D7. As a result, since the interior of the tank T1 is pressurized in advance with the gas, the processing liquid L is prevented from flowing into the tank T1 at an excessive flow rate (so-called overshoot) when the tank T1 is replenished with the processing liquid L.

Figure 7:
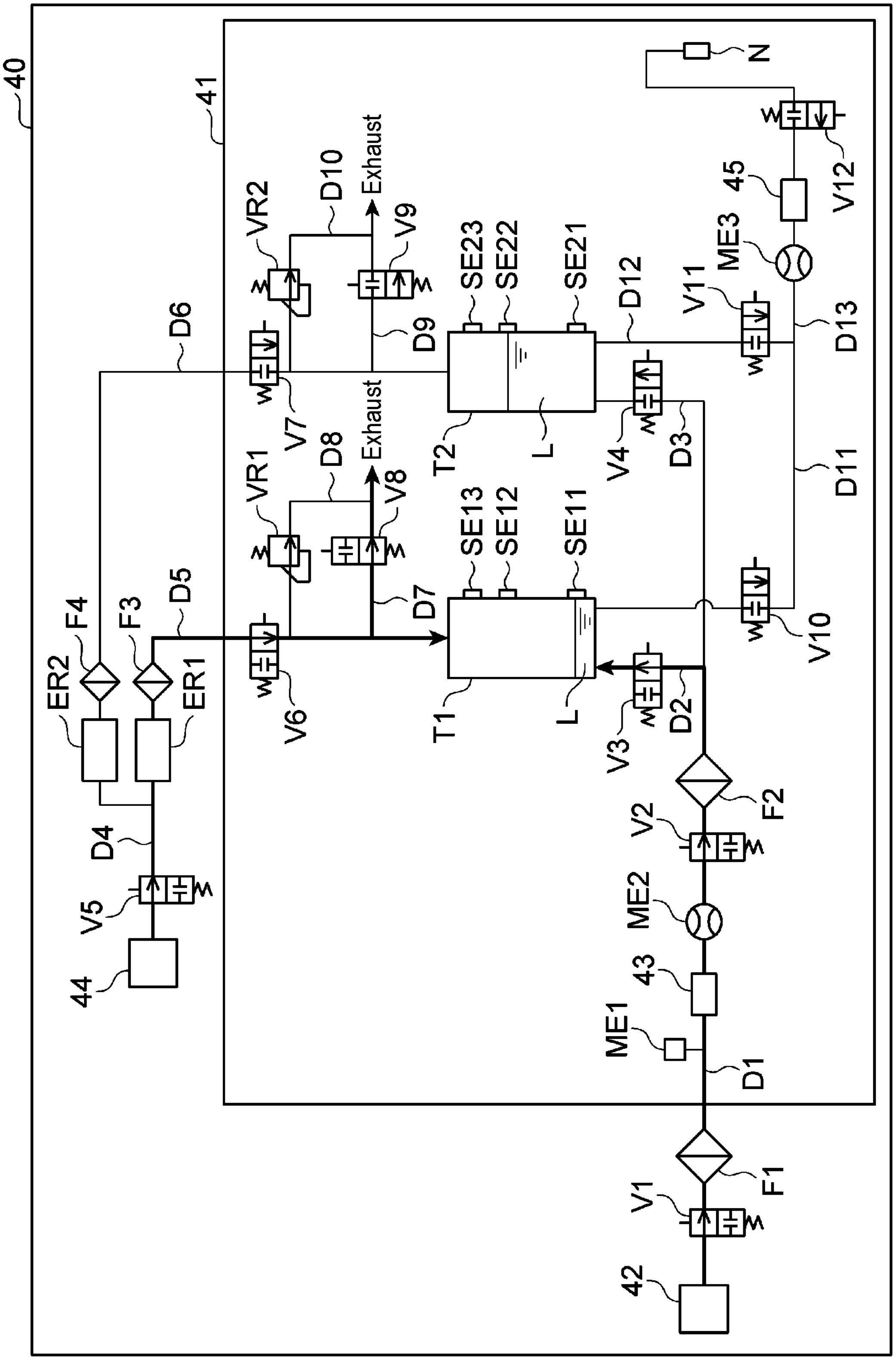
FIG. 7 is a view for explaining an operation of supplying the processing liquid to the tank.

Subsequently, as illustrated in FIG. 7, the controller Ctr controls the valves V1, V2, and V3 and the cooler 43 to open the valves V1, V2, V3 and to operate the cooler 43. As a result, the processing liquid L from the liquid source 42 is replenished into the tank T1. At this time, an opening degree of the valve V3 may be determined based on the pressure data measured by the pressure gauge ME1. In addition, the electropneumatic regulator ER1 may be controlled based on the flow rate data measured by the flow meter ME2 such that the pressure of the gas reaches a predetermined magnitude. Alternatively, the electropneumatic regulator ER1 may be controlled based on the flow rate data measured by the flow meter ME2 such that the flow rate of the processing liquid L flowing through the filter F2 becomes a flow rate set according to the filter F2.

Figure 8:
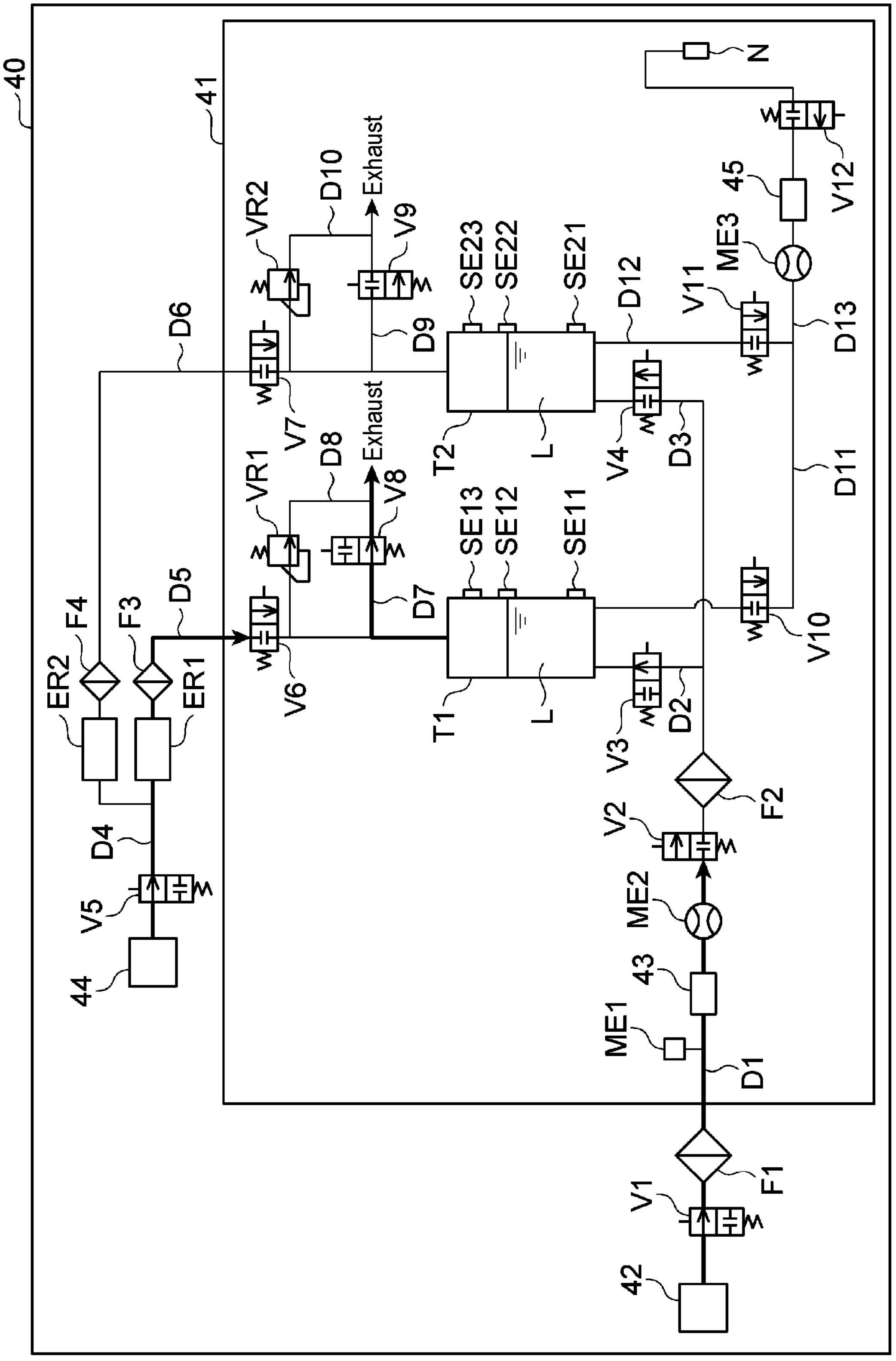
FIG. 8 is a view for explaining an operation of supplying the processing liquid to the tank.

When the processing liquid L from the liquid source 42 is replenished into the tank T1 and the sensor SE12 is turned ON (when the liquid level in the tank T1 reaches the sensor SE12), the controller Ctr controls the valves V2 and V6 to close the valves V2 and V6, as illustrated in FIG. 8. As a result, the replenishment of the processing liquid L to the tank T1 is stopped, and the gas in the tank T1 is exhausted via the pipes D5 and D7.

Figure 9:
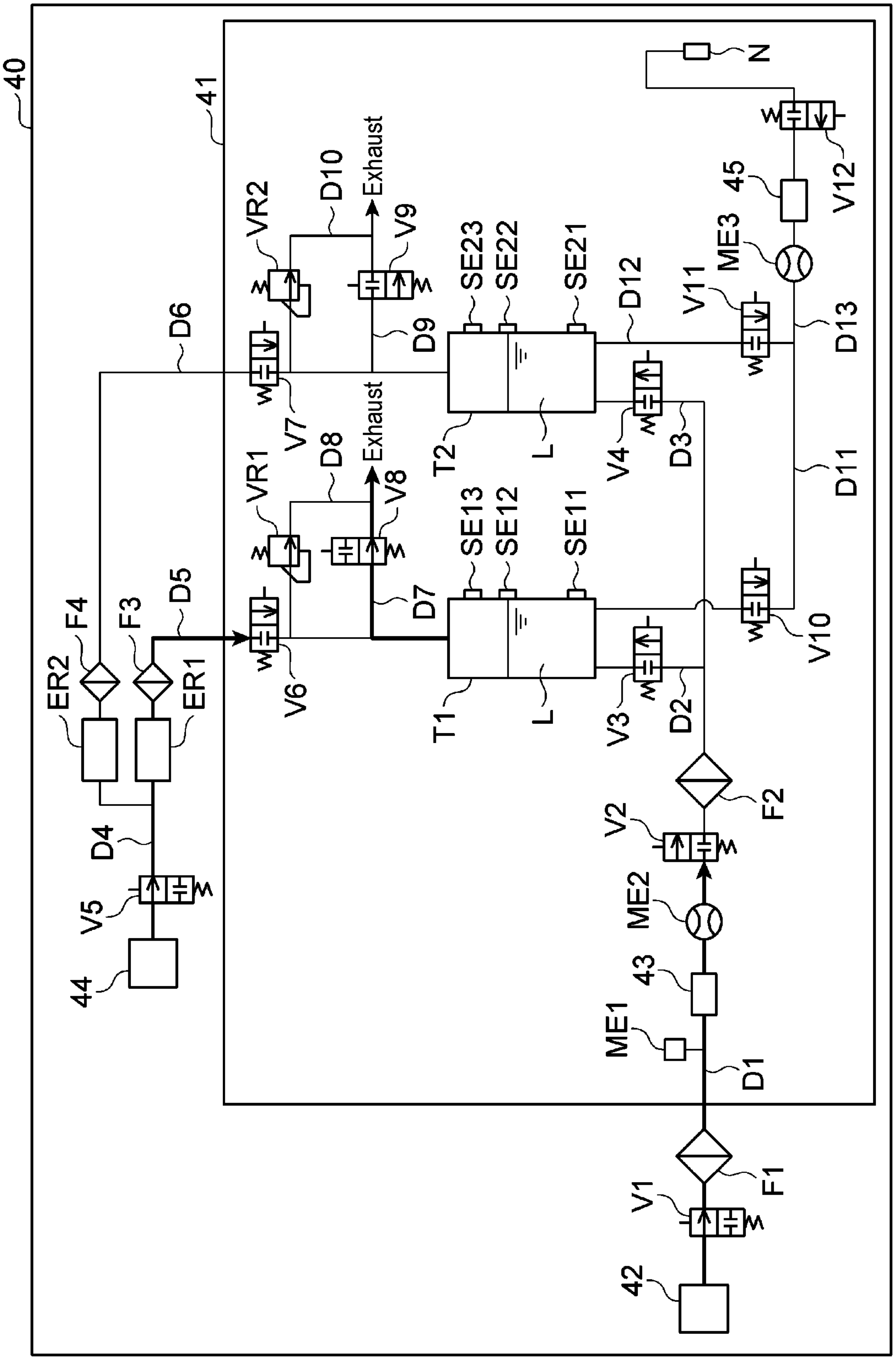
FIG. 9 is a view for explaining an operation of supplying the processing liquid to the tank.
Figure 10:
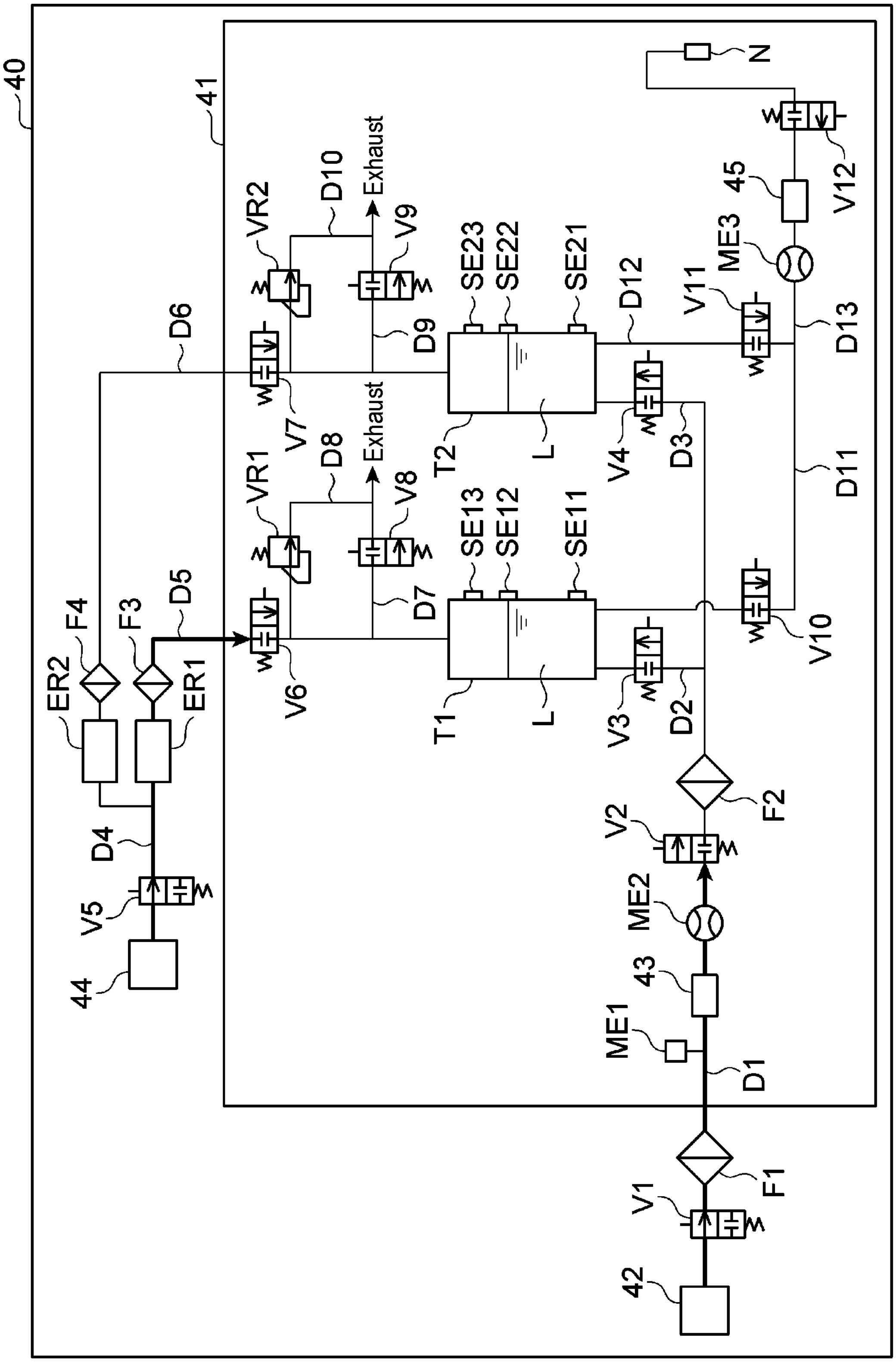
FIG. 10 is a view for explaining an operation of supplying the processing liquid to the tank.

Subsequently, as illustrated in FIG. 9, the controller Ctr controls the valve V3 to close the valve V3. This prevents the processing liquid L from being discharged from the tank T1. Subsequently, as illustrated in FIG. 10, the controller Ctr controls the valve V8 to close the valve V8. In this way, the tank T1 is sealed, and the process of replenishing the processing liquid L to the tank T1 is completed. The time for closing the valve V8 may be after a period of time required for the internal pressure of the tank T1 to become equal to an atmospheric pressure.

[Method of Supplying Processing Liquid in Tank to Substrate]

Next, a method of supplying the processing liquid L in the tanks T1 and T2 to the substrate W (a substrate processing method) will be described with reference to FIGS. 11 to 16. Here, the method of supplying the processing liquid L from the tank T1 to the substrate W and the method of supplying the processing liquid L from the tank T2 to the substrate W are performed in the same procedure. Therefore, the method of supplying the processing liquid L from the tank T1 to the substrate W will be described below, and the description of the method of supplying the processing liquid L from the tank T2 to the substrate W will be omitted.

Figure 11:
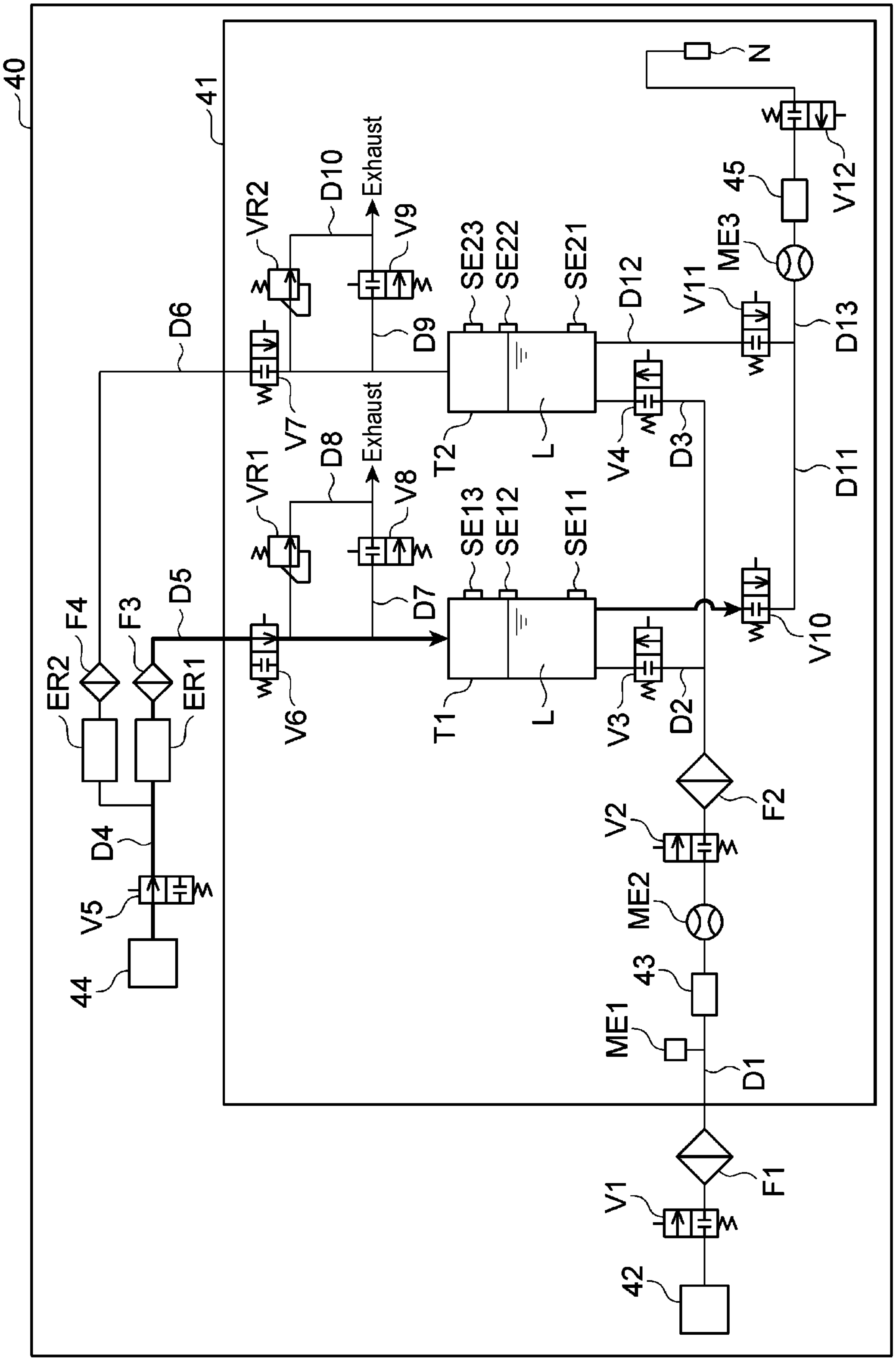
FIG. 11 is a view for explaining an operation of discharging the processing liquid from the tank.

First, as illustrated in FIG. 11, the controller Ctr controls the valves V5 and V6 and the electropneumatic regulator ER1 to open the valves V5 and V6 and to pressurize the interior of the tank T1 with gas. As a result, the interior of the tank T1 is pressurized with the gas.

Figure 12:
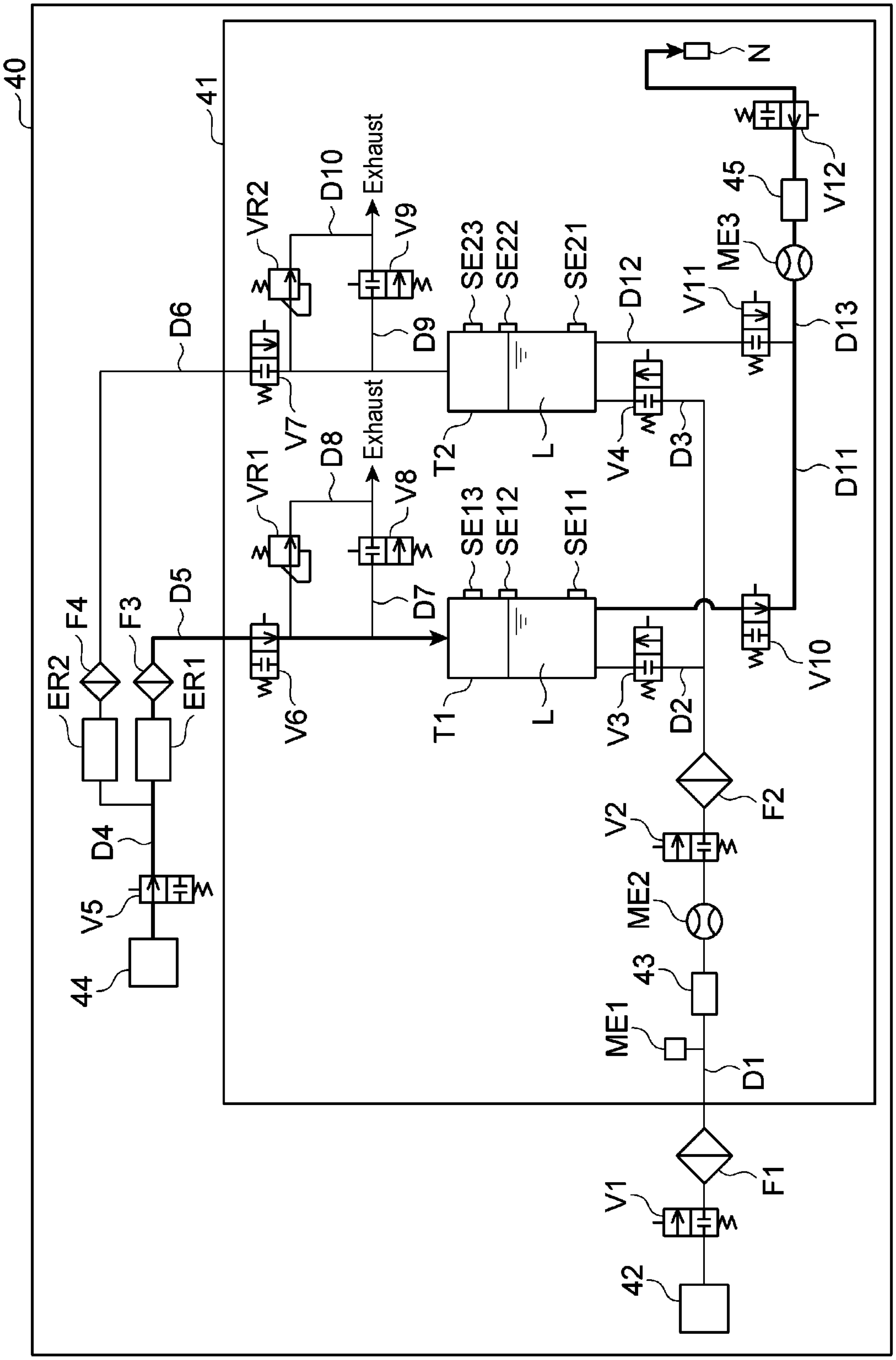
FIG. 12 is a view for explaining an operation of discharging the processing liquid from the tank.

Subsequently, as illustrated in FIG. 12, the controller Ctr controls the valves V10 and V12 and the heater 45 to open the valves V10 and V12 and to operate the heater 45. As a result, the processing liquid L flows from the tank T1 pressurized by the gas to the nozzle N via the pipes D11 and D13, and the processing liquid L heated by the heater 45 is supplied from the nozzle N to the substrate W. At this time, the electropneumatic regulator ER1 may be controlled based on the flow rate data measured by the flow meter ME3 such that the pressure of the gas reaches a predetermined magnitude. Alternatively, the electropneumatic regulator ER1 may be controlled based on the flow rate data measured by the flow meter ME3 such that the flow rate of the processing liquid L flowing through the pipe D13 reaches a predetermined magnitude.

Figure 13:
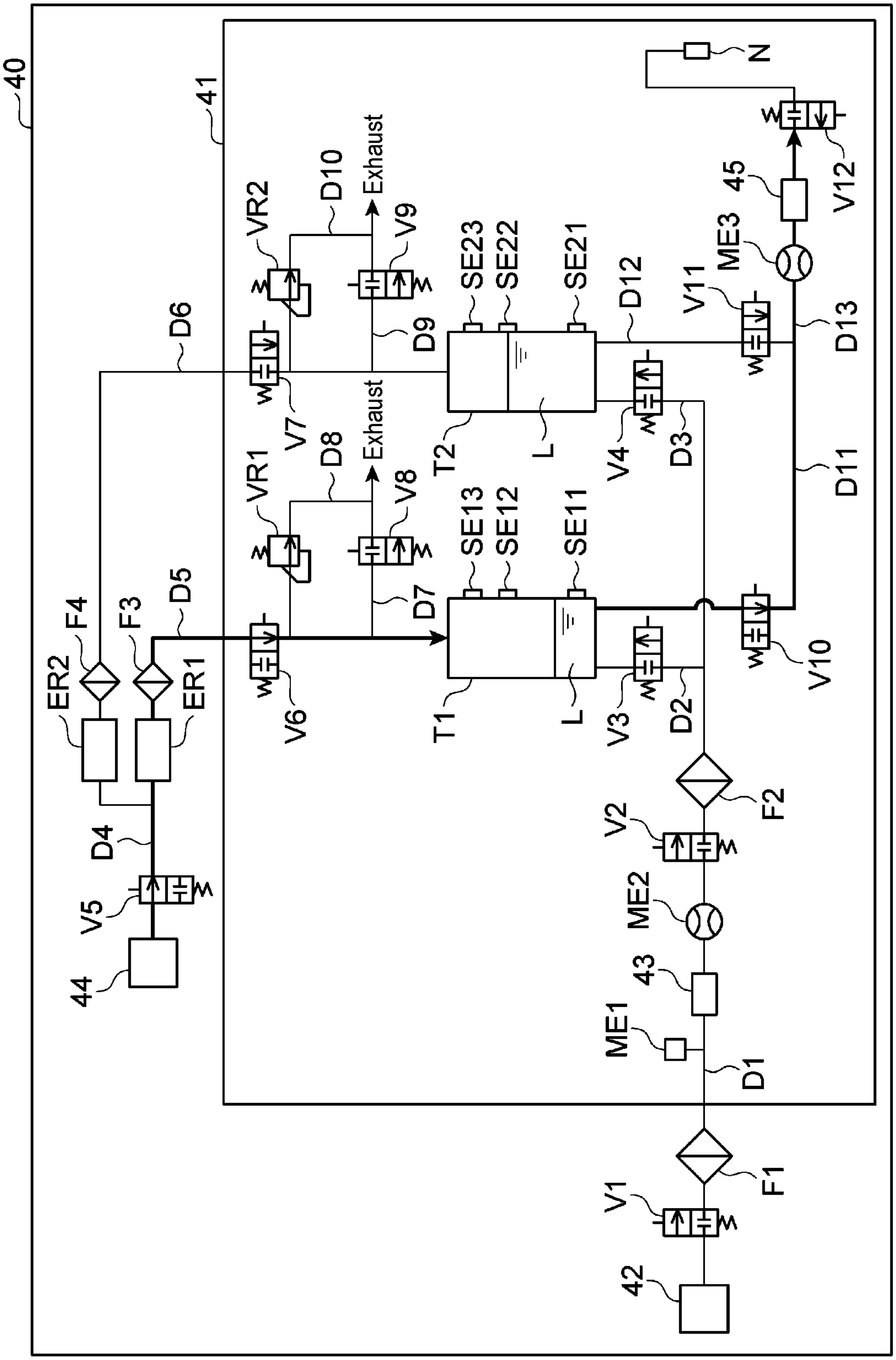
FIG. 13 is a view for explaining an operation of discharging the processing liquid from the tank.

When a predetermined amount of the processing liquid L (e.g., the amount of the processing liquid L set in the processing recipe) is supplied from the tank T1, the controller Ctr controls the valve V12 to close the valve V12 as illustrated in FIG. 13. As a result, the ejection of the processing liquid L from the nozzles N is stopped.

Figure 14:
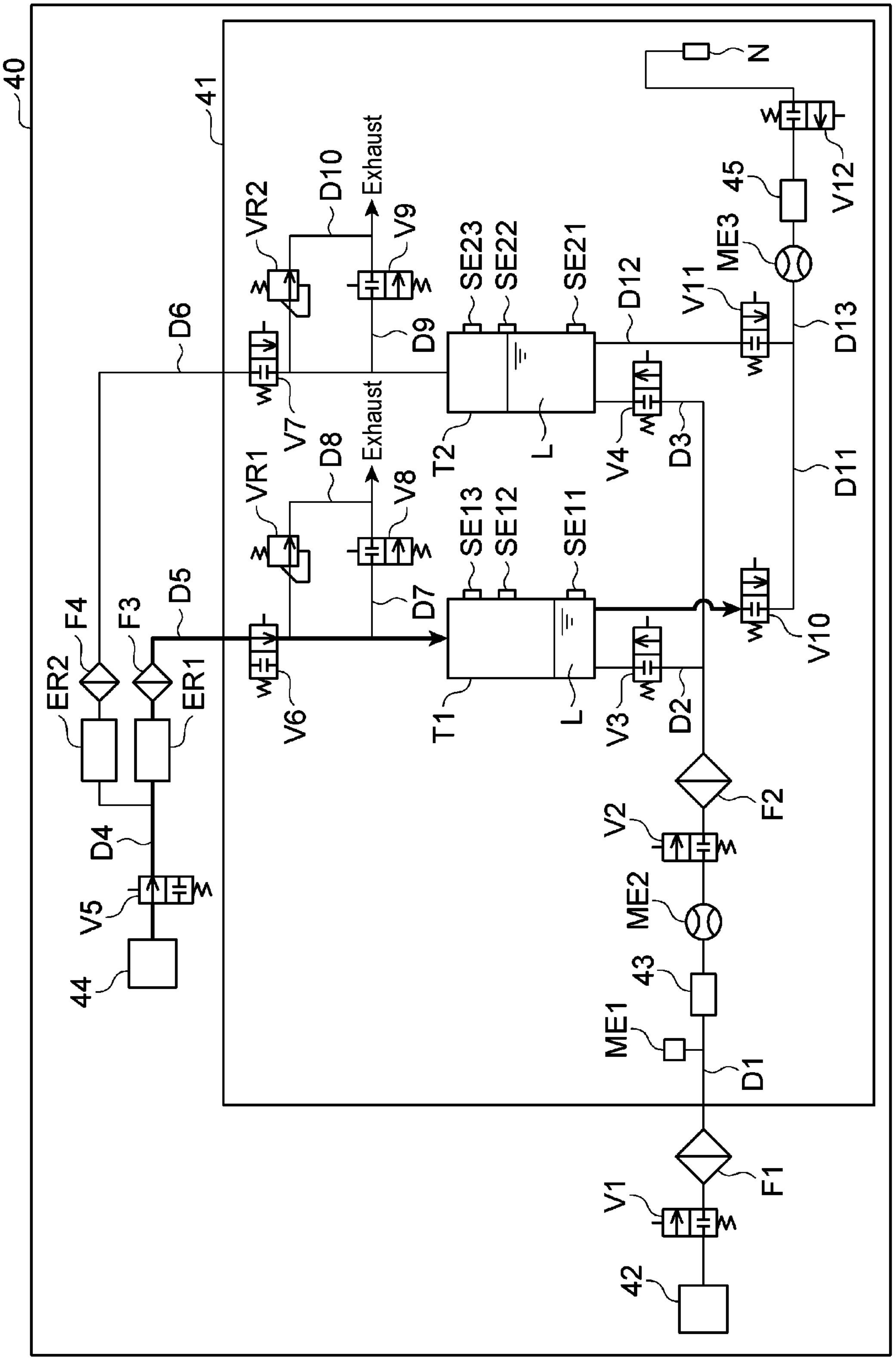
FIG. 14 is a view for explaining an operation of discharging the processing liquid from the tank.
Figure 15:
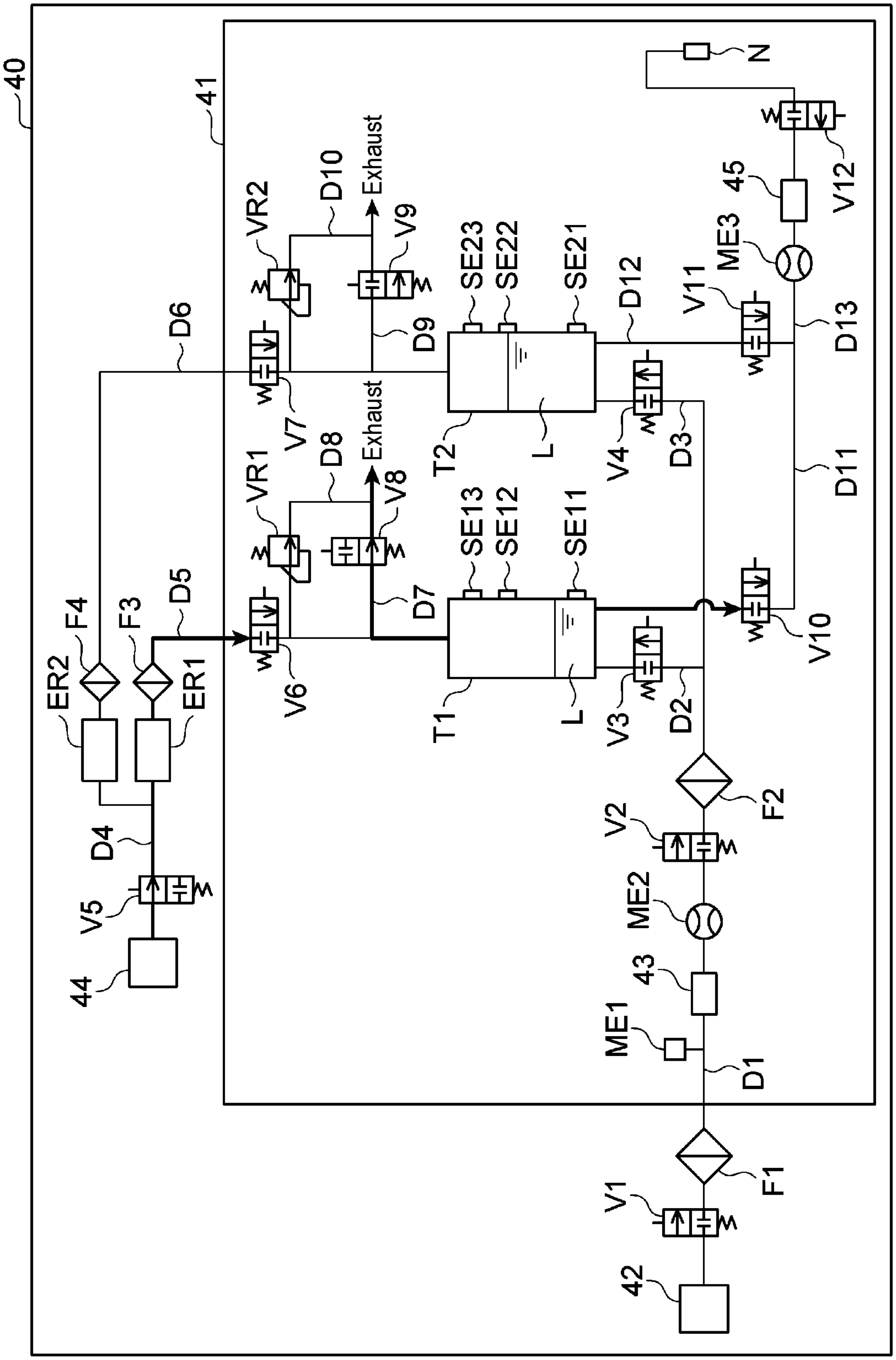
FIG. 15 is a view for explaining an operation of discharging the processing liquid from the tank.
Figure 16:
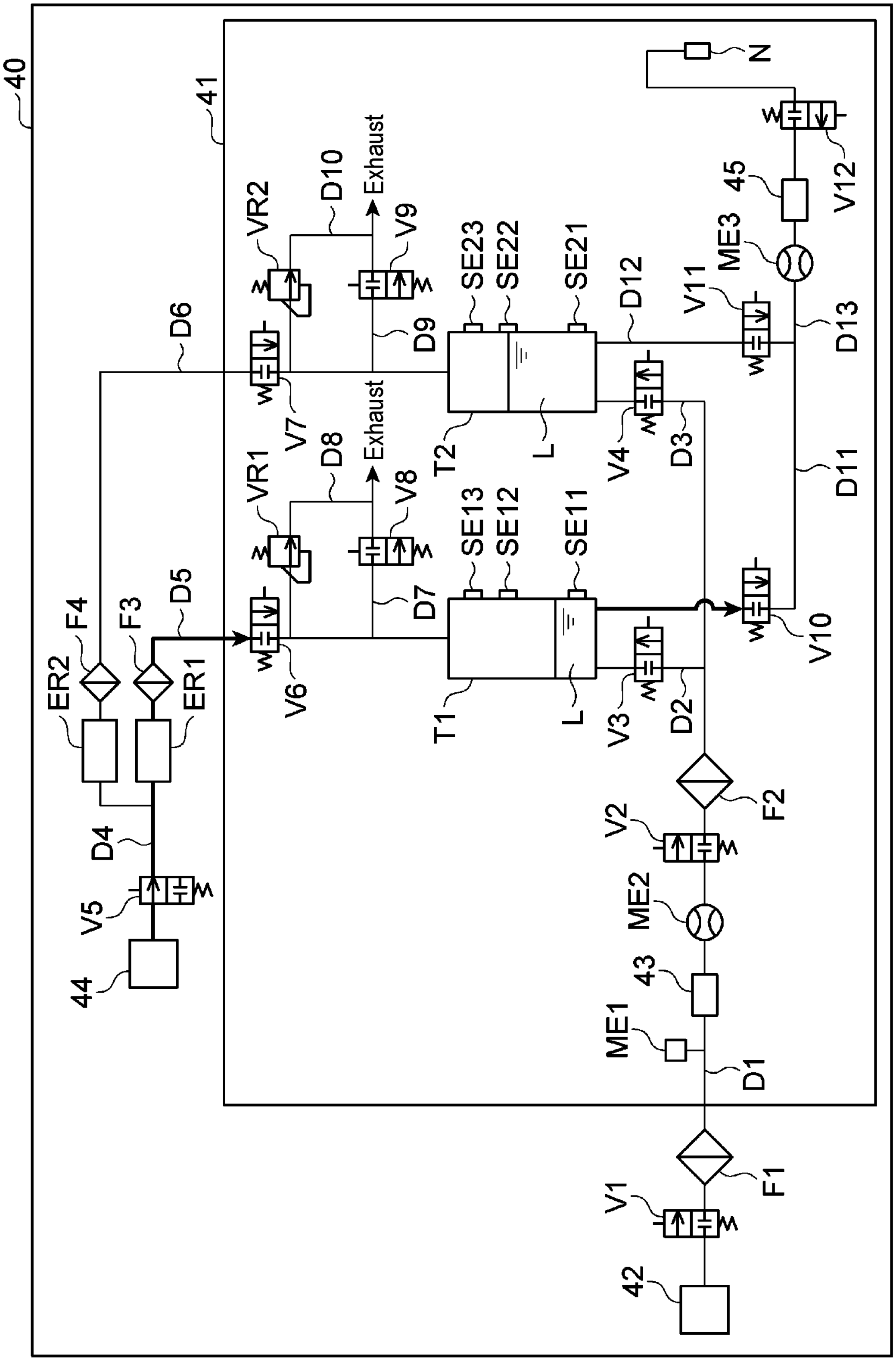
FIG. 16 is a view for explaining an operation of discharging the processing liquid from the tank.

Subsequently, as illustrated in FIG. 14, the controller Ctr controls the valve V10 to close the valve V10. This prevents the processing liquid L from being discharged from the tank T1. Subsequently, as illustrated in FIG. 15, the controller Ctr controls the valves V6 and V8 to close the valve V6 and to open the valve V8. As a result, the gas inside the tank T1 is exhausted via the pipes D5 and D7. Subsequently, as illustrated in FIG. 16, the controller Ctr controls the valve V8 to close the valve V8. In this way, the tank T1 is sealed, and the process of supplying the processing liquid L from the tank T1 to the substrate W is completed.

[Action]

According to the above-described example, without requiring the circulation of the processing liquid L as disclosed in Patent Document 1, the processing liquid L is temporarily stored in the tanks T1 and T2 according to the pressure acting in the tanks T1 and T2. Therefore, since driving elements (e.g., a pump, a constant pressure valve, and the like), which may be sources of dust generation, are reduced, mixing of the processing liquid L with foreign matter such as particles is suppressed. In addition, since a length of the flow path for the processing liquid L is shortened, elution of foreign matter from the pipes or the like that constitute the flow path is suppressed. Accordingly, it is possible to improve the cleanliness of the system for supplying the processing liquid L.

According to the above-described example, the filter F2 is disposed between the flow meter ME2 and the tanks T1 and T2. Therefore, before the processing liquid L reaches the tanks T1 and T2 from the liquid source 42, the processing liquid L is filtered by the filter F2. Therefore, it is possible to store the cleaned processing liquid L in the tanks T1 and T2. In addition, since circulation of the processing liquid L as disclosed in Patent Document 1 is not required, the number of times the processing liquid L passes through the filter F2 is one. Therefore, the contact amount of the processing liquid L with the filter F2 until the processing liquid L is supplied to the substrate W is greatly reduced. Accordingly, it is possible to prolong the lifetime of the filter F2.

Further, each filter is configured to flow at a set flow rate suitable for filtration for the type of each filter. When a flow rate is much lower than the set flow rate, a period of time during which the processing liquid L comes into contact with the filter increases so that foreign matter tends to be easily eluted from the filter. When a flow rate is much higher than the set flow rate, the processing liquid L flows through a region with low pressure loss in the filter so that a filtration efficiency tends to easily decrease. However, according to the above-described example, the electropneumatic regulators ER1 and ER2 are controlled such that the flow rate of the processing liquid L flowing through the filter F2 reaches the flow rate set according to the filter F2. Therefore, it is possible to obtain a predetermined filtration efficiency while suppressing the elution of foreign matter from the filter F2.

According to the above-described example, the valves V3 and V4 are disposed between the filter F2 and the tanks T1 and T2. Therefore, by regulating the flow rates of the processing liquid L flowing into the tanks T1 and T2 with the valves V3 and V4, even when the pressure of the processing liquid L supplied from the liquid source 42 fluctuates, the flow rates of the processing liquid L flowing into the tanks T1 and T2 are less likely to fluctuate. Therefore, the flow rate of the processing liquid L passing through the filter F2 is also less likely to fluctuate. Accordingly, it is possible to obtain a predetermined filtration efficiency while suppressing the elution of foreign matter from the filter F2.

According to the above-described example, the valves V3 and V4 are controlled based on the value of the pressure of the processing liquid L measured by the pressure gauge ME1. Therefore, even when the pressure of the processing liquid L supplied from the liquid source 42 fluctuates, the flow rates set in the valves V3 and V4 are adjusted each time. Accordingly, the flow rate of the processing liquid L passing through the filter F2 is less likely to fluctuate. Accordingly, it is possible to obtain a predetermined filtration efficiency while suppressing the elution of foreign matter from the filter F2.

According to the above-described example, the filter material constituting the filter F1 disposed upstream of the flow meter ME2 is made of polytetrafluoroethylene (PTFE), polyethylene (PE), or the like, and the processing liquid L may be isopropyl alcohol. In this case, since the isopropyl alcohol used as the processing liquid L is an organic solvent, the processing liquid L may contain metal-containing impurities. Therefore, the metal-containing impurities are removed by the filter F1 installed on the upstream side. Accordingly, it is possible to improve the cleanliness of the system for supplying the processing liquid L.

According to the above-described example, the rotary holder 30 and the liquid supplier 40 are arranged inside the same chamber 20. Therefore, the length of the flow path of the processing liquid L is further shortened. Accordingly, it is possible to improve the cleanliness of the system for supplying the processing liquid L. In addition, in each processing unit 10, since differences in lifting height between the tanks T1 and T2 and the discharge port of the nozzle N can be made substantially the same, it is possible to make uniform the control of substrate processing and the processing accuracy of substrates W.

According to the above-described example, the processing liquid L in the tanks T1 and T2 is ejected from the nozzle N by pressurizing the tanks T1 and T2 with the gas. Therefore, even when the processing liquid L is supplied from the tanks T1 and T2 to the substrate W, the same gas source 44 and electropneumatic regulators ER1 and ER2 as those used when replenishing the tanks T1 and T2 with the processing liquid L are used without requiring drive elements (e.g., a pump, a constant pressure valve, and the like) which may be sources of dust generation. Accordingly, since foreign matter such as particles are prevented from entering the processing liquid L, it is possible to improve the cleanliness of the system for supplying the processing liquid L. In addition, since the configuration of the processing unit 10 is simplified, it is possible to implement the substrate processing at a low cost.

According to the above-described example, when replenishing the tanks T1 and T2 with the processing liquid L, the tanks T1 and T2 are pressurized by supplying the gas to the tanks T1 and T2 while exhausting the gas. Therefore, even when the processing liquid L is replenished in the tanks T1 and T2 and the volume of the gas in the tanks T1 and T2 is reduced, the corresponding amount of gas is discharged from the pipe D7. Therefore, it is possible to replenish the processing liquid L in the tanks T1 and T2 while pressurizing the tanks T1 and T2 with the gas at a predetermined pressure without requiring a special operation or the like.

[Modifications]

It should be understood that the disclosure in this specification is exemplary in all respects and is not restrictive. Various omissions, substitutions, modifications, and the like may be made to the above-described example without departing from the scope and spirit of the claims.

(1) In the above-described example, when the processing liquid L is ejected from the nozzle N, the processing liquid L is heated by the heater 45. However, a heat source may be provided in the tanks T1 and T2 to heat the processing liquid L1 in the tanks T1 and T2.

(2) For example, when the controller Ctr determines that the amount of the processing liquid L in the tank T1 is smaller than a predetermined value (for example, when the sensor SE11 is turned OFF), the electropneumatic regulator ER2 and the valve V7 may be controlled. As a result, since air is supplied into the tank T2 and the tank T2 is pressurized, the processing liquid L in the tank T2 is ejected from the nozzle N. In this case, even when the amount of the processing liquid L in the tank T1 is small, the processing liquid L is supplied from the tank T2. Therefore, the waiting time for substrate processing is reduced. Therefore, it is possible to improve productivity. In addition, by replenishing the tank T1 with the processing liquid L while the processing liquid L is being supplied from the tank T2, the waiting time for subsequent substrate processing is reduced. Therefore, it is possible to further improve productivity.

(3) For example, when the controller Ctr determines that the amount of the processing liquid L in the tank T1 is smaller than a predetermined value (for example, when the sensor SE11 is turned OFF) while the processing liquid L is being supplied from the tank T1, stopping of pressurization into the tank and starting of pressurization into tank T2 may be executed. That is, when the controller Ctr makes the above determination, closing of the electropneumatic regulator ER1 and the valve V6 and starting of control of the electropneumatic regulator ER2 and the valve V7 may be executed substantially simultaneously. In this case, even when the amount of the processing liquid L in the tank T1 becomes smaller than a predetermined value, the processing liquid is continuously supplied from the tank T2. Therefore, interruption of the supply of the processing liquid L to the substrate W in the course of processing the substrate W is prevented. Therefore, it is possible to reliably execute the substrate processing.

(4) For example, the controller Ctr may determine whether or not the processing liquid L equal to or greater than a use amount specified in a processing recipe exists in the tanks T1 and T2. Then, when the processing liquid L equal to or greater than the use amount exists in the tanks T1 and T2, the supply of the processing liquid L to the nozzle N from the tanks T1 and T2 may be executed. In this case, interruption of the supply of the processing liquid L during the supply of the processing liquid L from the tanks T1 and T2 to the substrate W is prevented. Therefore, it is possible to reliably execute the substrate processing.

OTHER EXAMPLES

Example 1

An example of a substrate processing apparatus includes: a reservoir configured to temporarily store a processing liquid for processing a substrate; a replenisher configured to replenish the processing liquid to the reservoir; a flow rate measurer configured to measure a flow rate of the processing liquid replenished to the reservoir; a gas supplier configured to supply gas to the reservoir to pressurize an interior of the reservoir; and a controller. The controller is configured to control the gas supplier based on a value measured by the flow rate measurer to execute a process of replenishing the processing liquid from the replenisher to the reservoir while regulating a magnitude of a pressure in the reservoir. In this case, the processing liquid is temporarily stored in the reservoir according to the pressure acting in the reservoir without requiring circulation of the processing liquid as disclosed in Patent Document 1. Therefore, since driving elements (for example, a pump, a constant pressure valve, and the like), which may be sources of dust generation, are reduced, foreign matter such as particles is suppressed from being mixed into the processing liquid. In addition, since the length of the flow path for the processing liquid is shortened, the elution of foreign matter from a pipe or the like, which constitutes the flow path, is suppressed. Accordingly, it is possible to improve the cleanliness of a system for supplying the processing liquid.

Example 2

The substrate processing apparatus of Example 1 may further include a filter disposed between the flow rate measurer and the reservoir. In this case, the processing liquid is filtered by the filter before the processing liquid reaches the reservoir from the replenisher. Therefore, it is possible to store a cleaned processing liquid in the reservoir. In addition, since circulation of the processing liquid as disclosed in Patent Document 1 is not required, the number of times the processing liquid passes through the filter is one. Therefore, the amount of the processing liquid which comes into contact with the filter until the processing liquid is supplied to the substrate is greatly reduced. Therefore, it is possible to prolong the lifespan of the filter.

Example 3

In the substrate processing apparatus of Example 2, the process of replenishing the processing liquid from the replenisher to the reservoir may include regulating the magnitude of the pressure in the reservoir by controlling the gas supplier such that a value measured by the flow rate measurer reaches a flow rate set according to the filter. Each filter is configured to flow at a set flow rate suitable for filtration for the type of each filter. When a flow rate is much lower than the set flow rate, the period of time during which the processing liquid comes into contact with the filter increases, and foreign matter tends to be easily eluted from the filter. When a flow rate is much higher than the set flow rate, the processing liquid flows through a region with low pressure loss in the filter, and a filtration efficiency tends to easily decrease. However, according to Example 3, the gas supplier is controlled such that the flow rate of the processing liquid flowing through the filter reaches the flow rate set according to the filter. Therefore, it is possible to obtain a predetermined filtration efficiency while suppressing the elution of foreign matter from the filter.

Example 4

In the substrate processing apparatus of Example 2 or 3, the filter material that constitutes the filter may be made of polyimide.

Example 5

The substrate processing apparatus of any one of Examples 2 to 4 may further include a flow rate regulator disposed between the filter and the reservoir and further configured to regulate a flow rate of the processing liquid flowing into the reservoir. In this case, by regulating the flow rate of the processing liquid flowing into the reservoir by the flow regulator, even when the pressure of the processing liquid supplied from the replenisher fluctuates, the flow rate of the processing liquid flowing into the reservoir is less likely to fluctuate. Therefore, the flow rate of the processing liquid passing through the filter is also less likely to fluctuate. Accordingly, it is possible to obtain a predetermined filtration efficiency while suppressing the elution of foreign matter from the filter.

Example 6

The substrate processing apparatus of Example 5 may further include a pressure measurer configured to measure a pressure of the processing liquid flowing upstream side of the filter, wherein the controller may be configured to control the flow rate regulator based on a value measured by the pressure measurer to further execute a process of regulating the flow rate of the processing liquid flowing into the reservoir. In this case, even when the pressure of the processing liquid supplied from the replenisher fluctuates, the flow rate set in the flow regulator is regulated each time. Therefore, the flow rate of the processing liquid passing through the filter is less likely to fluctuate. Accordingly, it is possible to obtain a predetermined filtration efficiency while suppressing the elution of foreign matter from the filter.

Example 7

The substrate processing apparatus of any one of Examples 1 to 6 may further include a separate filter disposed at an upstream side of the flow rate measurer, wherein a filter material that constitutes the separate filter may be made of polytetrafluoroethylene or polyethylene, and the processing liquid may be isopropyl alcohol. In this case, since isopropyl alcohol (IPA), which is the processing liquid, is an organic solvent, the processing liquid may contain metal-containing impurities. Therefore, the metal-containing impurities are removed by the separate filter installed on the upstream side. Accordingly, it is possible to improve the cleanliness of a system for supplying the processing liquid.

Example 8

The substrate processing apparatus of any one of Examples 1 to 7 may further include a rotary holder configured to hold and rotate the substrate, and a container configured to accommodate the rotary holder and the reservoir. In this case, the reservoir configured to store the processing liquid and the rotary holder configured to rotate and hold the substrate to which the processing liquid is supplied from the reservoir are present in the same container. Therefore, it is possible to further shorten the length of a processing liquid flow path. Accordingly, it is possible to improve the cleanliness of a system for supplying the processing liquid.

Example 9

The substrate processing apparatus of any one of Examples 1 to 8 may further include a nozzle connected in a fluidic sense to the reservoir, wherein the controller may be configured to control the gas supplier to pressurize the interior of the reservoir and further execute a process of ejecting the processing liquid in the reservoir from the nozzle. In this case, even when the processing liquid is supplied from the reservoir to the substrate, there is no need for a driving element (for example, a pump, a constant pressure valve, or the like), which may be a source of dust generation, and the same gas supplier as that used when replenishing the processing liquid to the reservoir is used. Therefore, since foreign mater such as particles is suppressed from being mixed into the processing liquid, it is possible to improve the cleanliness of a system for supplying the processing liquid. Moreover, since the configuration of the substrate processing apparatus is simplified, it is possible to implement the substrate processing at a low cost.

Example 10

In the substrate processing apparatus of Example 9, the process of ejecting the processing liquid from the nozzle may include controlling the gas supplier to pressurize the interior of the reservoir at a pressure higher than the pressure in the process of replenishing the reservoir with the processing liquid from the replenisher.

Example 11

The substrate processing apparatus of Example 9 or 10 may further include a separate reservoir configured to temporarily store the processing liquid, wherein the nozzle may be connected in a fluidic sense to the separate reservoir, the gas supplier may be configured to supply gas to the separate reservoir to pressurize an interior of the separate reservoir, and the process of ejecting the processing liquid from the nozzle may include controlling, when an amount of the processing liquid in the reservoir is smaller than a predetermined value, the gas supplier to pressurize the interior of the separate reservoir and eject the processing liquid in the separate reservoir from the nozzle. In this case, even when the amount of the processing liquid in the reservoir is small, the processing liquid is supplied from the separate reservoir. Therefore, the waiting time for substrate processing is reduced. Accordingly, it is possible to improve productivity. In addition, by replenishing the reservoir with the processing liquid while the processing liquid is being supplied from the separate reservoir, the waiting time for subsequent substrate processing is reduced. Therefore, it is possible to further improve productivity.

Example 12

The substrate processing apparatus of Example 11 may further include a detector configured to detect the amount of the processing liquid in the reservoir, wherein the process of ejecting the processing liquid from the nozzle may include controlling, when the detector detects that the amount of the processing liquid in the reservoir is smaller than a predetermined value, the gas supplier to stop the pressurizing of the interior of the reservoir and to start the pressurizing of the interior of the separate reservoir during the ejecting of the processing liquid from the nozzle. In this case, even when the amount of the processing liquid in the reservoir is small, the processing liquid is continuously supplied from the separate reservoir. Therefore, interruption of the supply of the processing liquid to the substrate in the course of processing the substrate is prevented. Therefore, it is possible to reliably execute the substrate processing.

Example 13

In the substrate processing apparatus of Example 11, the process of ejecting the processing liquid from the nozzle may include controlling, when a processing liquid equal to or greater than a use amount of the processing liquid specified in a recipe of processing the substrate exists in the reservoir or the separate reservoir, the gas supplier to pressurize the interior of the reservoir or the interior of the separate reservoir and eject the processing liquid in the reservoir or the separate reservoir from the nozzle. In this case, the supply of the processing liquid is prevented from being interrupted while the processing liquid is being supplied from the reservoir or the separate reservoir to the substrate. Therefore, it is possible to reliably execute the substrate processing.

Example 14

In the substrate processing apparatus of any one of Examples 1 to 13, the gas supplier may include a first flow path connected to the reservoir and a second flow path branched from the first flow path, wherein the process of replenishing the processing liquid from the replenisher to the reservoir may include controlling the gas supplier to supply the gas into the reservoir through the first flow path while exhausting the gas from the second flow path, thus pressurizing the interior of the reservoir. In this case, even when the processing liquid is replenished in the reservoir and the volume of the gas in the reservoir is reduced, the corresponding amount of the gas is discharged from the second flow path. Therefore, it is possible to replenish the interior of the reservoir with the processing liquid while pressurizing the interior of the reservoir at a predetermined pressure with the gas without requiring a special operation or the like.

Example 15

An example of a substrate processing method includes: supplying gas from a gas supplier to a reservoir configured to temporarily store a processing liquid for processing a substrate to pressurize an interior of the reservoir; measuring, by a flow rate measurer, a flow rate of the processing liquid when the reservoir is replenished with the processing liquid for processing the substrate; and replenishing the processing liquid from a replenisher to the reservoir while regulating a magnitude of the pressure in the reservoir by the gas supplier based on a value measured by the flow rate measurer. In this case, the same effect as that of the substrate processing apparatus of Example 1 is obtained.

Example 16

In the substrate processing method of Example 15, the replenishing the processing liquid from the replenisher to the reservoir may include regulating the magnitude of the pressure in the reservoir by the gas supplier such that a value measured by the flow rate measurer reaches a flow rate set according to a filter disposed between the flow rate measurer and the reservoir. In this case, the same effect as that of the substrate processing apparatus of Example 3 is obtained.

Example 17

The substrate processing method of Example 16 may further include measuring a pressure of the processing liquid flowing upstream of the filter by a pressure measurer, and regulating the flow rate of the processing liquid flowing into the reservoir based on a value measured by the pressure measurer. In this case, the same effect as that of the substrate processing apparatus of Example 6 is obtained.

Example 18

The substrate processing method of any one of Examples 15 to 17 may further include ejecting the processing liquid in the reservoir from a nozzle connected in a fluidic sense to the reservoir by pressurizing the interior of the reservoir by the gas supplier. In this case, the same effect as that of the substrate processing apparatus of Example 9 is obtained.

Example 19

In the substrate processing method of Example 18, the ejecting the processing liquid from the nozzle may include pressurizing, when an amount of the processing liquid in the reservoir is smaller than a predetermined value, an interior of a separate reservoir configured to temporarily store the processing liquid, thus ejecting the processing liquid in the separate reservoir from the nozzle connected in a fluidic sense to the separate reservoir. In this case, the same effect as that of the substrate processing apparatus of Example 10 is obtained.

Example 20

In the substrate processing method of Example 18 or 19, the replenishing the reservoir with the processing liquid from the replenisher may include pressurizing the interior of the reservoir by the gas supplier by supplying the gas into the reservoir while exhausting the gas midway. In this case, the same effect as that of the substrate processing apparatus of Example 14 is obtained.

With the substrate processing apparatus and the substrate processing method according to the present disclosure, it is possible to improve the cleanliness of a system for supplying a processing liquid.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
- a reservoir configured to temporarily store a processing liquid for processing a substrate;
- a replenisher configured to replenish the processing liquid to the reservoir;
- a flow rate measurer configured to measure a flow rate of the processing liquid replenished to the reservoir;
- a filter disposed between the flow rate measurer and the reservoir;
- a gas supplier configured to supply gas to the reservoir to pressurize an interior of the reservoir; and
- a controller,
- wherein the controller is configured to control the gas supplier based on a value measured by the flow rate measurer to execute a process of replenishing the processing liquid from the replenisher to the reservoir while regulating a magnitude of an internal pressure of the reservoir.

2. The substrate processing apparatus of claim 1, wherein the process of replenishing the processing liquid from the replenisher to the reservoir includes regulating the magnitude of the internal pressure of the reservoir by controlling the gas supplier such that the value measured by the flow rate measurer corresponds to a flow rate set according to the filter.

3. The substrate processing apparatus of claim 1, wherein a filter material that constitutes the filter is made of polyimide.

4. The substrate processing apparatus of claim 1, further comprising:
- a flow rate regulator disposed between the filter and the reservoir and configured to regulate the flow rate of the processing liquid flowing into the reservoir.

5. The substrate processing apparatus of claim 4, further comprising:

a pressure measurer configured to measure a pressure of the processing liquid flowing through an upstream side of the filter, wherein the controller is configured to control the flow rate regulator based on a value measured by the pressure measurer to further execute a process of regulating the flow rate of the processing liquid flowing into the reservoir.

6. The substrate processing apparatus of claim 1, further comprising:

a rotary holder configured to hold and rotate the substrate; and a container configured to accommodate the rotary holder and the reservoir.

7. The substrate processing apparatus of claim 1, further comprising:

a nozzle connected in a fluidic sense to the reservoir, wherein the controller is configured to control the gas supplier to pressurize the interior of the reservoir and to further execute a process of ejecting the processing liquid in the interior of the reservoir from the nozzle.

8. The substrate processing apparatus of claim 7, wherein the process of ejecting the processing liquid from the nozzle includes controlling the gas supplier to pressurize the interior of the reservoir at a pressure higher than a pressure in the process of replenishing the reservoir with the processing liquid from the replenisher.

9. The substrate processing apparatus of claim 7, further comprising:

a separate reservoir configured to temporarily store the processing liquid, wherein the nozzle is connected in a fluidic sense to the separate reservoir, wherein the gas supplier is configured to supply gas to the separate reservoir to pressurize an interior of the separate reservoir, and wherein the process of ejecting the processing liquid from the nozzle includes controlling, when an amount of the processing liquid in the reservoir is smaller than a predetermined value, the gas supplier to pressurize the interior of the separate reservoir and eject the processing liquid in the separate reservoir from the nozzle.

10. The substrate processing apparatus of claim 9, further comprising:

a detector configured to detect the amount of the processing liquid in the reservoir, wherein the process of ejecting the processing liquid from the nozzle includes controlling, when the detector detects that the amount of the processing liquid in the reservoir is smaller than the predetermined value, the gas supplier to stop the pressurizing of the interior of the reservoir and to start the pressurizing of the interior of the separate reservoir during the ejecting of the processing liquid from the nozzle.

11. The substrate processing apparatus of claim 9, wherein the process of ejecting the processing liquid from the nozzle includes controlling, when a processing liquid equal to or greater than a use amount of the processing liquid specified in a recipe of processing the substrate exists in the reservoir or the separate reservoir, the gas supplier to pressurize the interior of the reservoir or the interior of the separate reservoir and eject the processing liquid in the reservoir or the separate reservoir from the nozzle.

12. The substrate processing apparatus of claim 1, wherein the gas supplier includes a first flow path connected to the reservoir and a second flow path branched from the first flow path, and wherein the process of replenishing the processing liquid from the replenisher to the reservoir includes controlling the gas supplier to supply the gas into the reservoir through the first flow path while exhausting the gas from the second flow path and pressurize the interior of the reservoir.

13. A substrate processing apparatus comprising:

a reservoir configured to temporarily store a processing liquid for processing a substrate;

a replenisher configured to replenish the processing liquid to the reservoir;

a flow rate measurer configured to measure a flow rate of the processing liquid replenished to the reservoir;

a separate filter disposed at an upstream side of the flow rate measurer;

a gas supplier configured to supply gas to the reservoir to pressurize an interior of the reservoir; and a controller, wherein the controller is configured to control the gas supplier based on a value measured by the flow rate measurer to execute a process of replenishing the processing liquid from the replenisher to the reservoir while regulating a magnitude of an internal pressure of the reservoir, and wherein a filter material that constitutes the separate filter is made of polytetrafluoroethylene, polyethylene, or polyimide, and the processing liquid is isopropyl alcohol.

14. A substrate processing method comprising:

supplying gas from a gas supplier to a reservoir configured to temporarily store a processing liquid for processing a substrate to pressurize an interior of the reservoir;

measuring, by a flow rate measurer, a flow rate of the processing liquid when the reservoir is replenished with the processing liquid for processing the substrate; and replenishing the processing liquid from a replenisher to the reservoir while regulating a magnitude of an internal pressure of the reservoir by the gas supplier based on a value measured by the flow rate measurer, wherein the replenishing the processing liquid from the replenisher to the reservoir includes regulating the magnitude of the internal pressure of the reservoir by the gas supplier such that the value measured by the flow rate measurer corresponds to a flow rate set according to a filter disposed between the flow rate measurer and the reservoir.

15. The substrate processing method of claim 14, further comprising:

measuring a pressure of the processing liquid flowing upstream of the filter by a pressure measurer; and regulating the flow rate of the processing liquid flowing into the reservoir based on a value measured by the pressure measurer.

16. The substrate processing method of claim 14, further comprising:

ejecting the processing liquid in the reservoir from a nozzle connected in a fluidic sense to the reservoir by pressurizing the interior of the reservoir by the gas supplier.

17. The substrate processing method of claim 16, wherein the ejecting the processing liquid from the nozzle includes pressurizing, when an amount of the processing liquid in the reservoir is smaller than a predetermined value, an interior of a separate reservoir configured to temporarily store the processing liquid and eject the processing liquid in the separate reservoir from the nozzle connected in a fluidic sense to the separate reservoir.

18. The substrate processing method of claim 16, wherein the replenishing the reservoir with the processing liquid from the replenisher includes pressurizing the interior of the reservoir by the gas supplier by supplying the gas into the reservoir while exhausting the gas midway.

* * * * *